US007365658B2

(12) United States Patent
Todorov et al.

(10) Patent No.: US 7,365,658 B2
(45) Date of Patent: Apr. 29, 2008

(54) METHOD AND APPARATUS FOR LOSSLESS RUN-LENGTH DATA ENCODING

(75) Inventors: Vladimir Todorov Todorov, Sofia (BG); Roumen Kirilov Kountchev, Sofia (BG); Mariofanna Geourgieva Milanova, Little Rock, AR (US); Roumiana Atanassova Kountcheva, Sofia (BG); Charles Wesley Ford, Jr., McDonough, GA (US)

(73) Assignee: The Board of Trustees of the University of Arkansas, Little Rock, AR (US)

( * ) Notice: Subject to any disclaimer, the term of this patent is extended or adjusted under 35 U.S.C. 154(b) by 0 days.

(21) Appl. No.: 11/447,573

(22) Filed: Jun. 6, 2006

(65) Prior Publication Data

US 2007/0279261 A1 Dec. 6, 2007

Related U.S. Application Data

(60) Provisional application No. 60/778,036, filed on Feb. 28, 2006.

(51) Int. Cl.
*H03M 7/46* (2006.01)
(52) U.S. Cl. .............................. 341/63; 341/51; 341/50
(58) Field of Classification Search ................ 341/50, 341/51, 63, 65, 107; 382/246, 249
See application file for complete search history.

(56) References Cited

U.S. PATENT DOCUMENTS

| | | | |
|---|---|---|---|
| 4,464,650 A | 8/1984 | Eastman et al. .............. 341/55 |
| 4,558,302 A | 12/1985 | Welch .......................... 341/51 |
| 4,586,027 A | 4/1986 | Tsukiyama et al. ........... 341/95 |
| 4,872,009 A | 10/1989 | Tsukiyama et al. ........... 341/55 |
| 4,988,998 A | 1/1991 | O'Brien ........................ 341/95 |
| 5,049,881 A | 9/1991 | Gibson et al. ................ 341/95 |
| 5,051,745 A | 9/1991 | Katz ............................ 341/51 |
| 5,140,321 A | 8/1992 | Jung ............................ 341/55 |
| 5,150,430 A | 9/1992 | Chu ............................ 382/246 |
| 5,347,650 A | 9/1994 | Arditti et al. | |
| 5,353,024 A | 10/1994 | Graybill ....................... 341/51 |
| 5,717,788 A | 2/1998 | Barnsley ..................... 382/249 |
| 5,933,104 A * | 8/1999 | Kimura ........................ 341/87 |
| 5,943,045 A * | 8/1999 | Ikeshoji et al. ............. 382/162 |
| 6,021,224 A | 2/2000 | Castelli et al. .............. 382/232 |
| 6,756,922 B2 * | 6/2004 | Ossia ........................... 341/51 |
| 6,950,114 B2 * | 9/2005 | Honda et al. ............... 345/626 |
| 7,051,270 B2 * | 5/2006 | Miyauchi et al. ........... 714/794 |

(Continued)

OTHER PUBLICATIONS

Salomon, David, "Data Compression, The Complete Reference," 3d. ed. (Springer 2004), pp. 20-35.

(Continued)

*Primary Examiner*—Peguy JeanPierre
(74) *Attorney, Agent, or Firm*—J. Charles Dougherty

(57) ABSTRACT

An apparatus and method for lossless run-length data encoding is disclosed. In the first stage of the method, an input data sequence is transformed without increasing its volume in order to obtain long sequences of identical digits. In the second stage, every such sequence is replaced with a unique shorter sequence. The compressed data is decoded performing corresponding inverse operations. The method is very efficient for compression of some classes of digital images with long sequences of the same number, such as graphics, texts, signatures, and fingerprints.

53 Claims, 8 Drawing Sheets

U.S. PATENT DOCUMENTS 7,058,220 B2 * 6/2006 Obrador .................... 382/168
7,088,269 B2 * 8/2006 Kadono et al. ............... 341/67
7,158,682 B2 * 1/2007 Sano ......................... 382/236

OTHER PUBLICATIONS

Shi, Yun Q., and Sun, Huifang, "Image and Video Compression for Multimedia Engineering, Fundamentals, Algorithms, and Standards" (CRC Press 2000), ch. 6.

Milanova, Mariofanna et al., "Lossless Compression of Contour Images, Representing American Sign Language," presented at Global Educational Technology Symposium (GETS), May 4-6, 2005, Univ. of Ark. at Little Rock.

Kountchev, Roumen et al., "Fingerprints Compression with IDP," presented at 40th Int'l Scientific Conf. on Information, Comunication and Energy Systems and Technologies (ICEST '05), Serbia and Montenegro, Niš, Jun. 29-Jul. 1, 2005, pp. 661-664.

Kountchev, R. et al., "Lossless Image Compression with IDP Decomposition," presented at 39th Int'l Scien Int'l Scientific Conf. on Information, Comunication and Energy Systems and Technologies (ICEST '04), Bitola, Macedonia, 2004, pp. 127-130.

Milanova, M. et al., "Lossless Data Compression for Image Decomposition with Recursive IDP Algorithm," presented at 17th Annual Conf. on Pattern Recognition (ICPR), Cambridge, UK, Aug. 23-26, 2004, pp. 823-826.

Kountchev, Roumen et al., "Lossless Image Compression with IDP and Adaptive RLC," presented at CISST'04, Las Vegas, NV, Jun. 21-24, 2004, pp. 608-612.

Kountchev, Roumen et al., "Detection and Lossless Compression of Texts and Graphics in Compound Images," presented at Int'l Sympoisum on Innovations in Intelligent Systems and Applications (INISTA 2005), Jun. 15-18, 2005, Istanbul, Turkey, pp. 1-4.

* cited by examiner

METHOD AND APPARATUS FOR LOSSLESS RUN-LENGTH DATA ENCODING

This application claims the benefit of U.S. Provisional Application No. 60/778,036 filed Feb. 28, 2006.

BACKGROUND OF THE INVENTION

The present invention relates to an apparatus and method for processing digital data sequences wherein the data is coded and subsequently restored, and further relates to data compression wherein data that is compressed and then subsequently decompressed is identical to the original.

Any algorithm for lossless data compression must, by definition, allow the original data to be wholly reconstructed from the compressed data. No known algorithm in this class, however, can guarantee compression for all possible input data sets. In other words, for any lossless data compression algorithm there will be an input data set that does not get smaller when processed by the algorithm. Thus any lossless compression algorithm that makes some files shorter will make some files longer as well. Good compression algorithms are those that achieve shorter output on input distributions that occur in real-world data. While, in principle, any general purpose lossless compression algorithm can be used on any type of data, many are unable to achieve significant compression on data that is not of the form for which they are designed to operate.

The most well-known methods for lossless data compression may be classified as follows: (1) run-length coding methods; (2) dictionary-based coding methods, such as Lempel-Ziv algorithms LZ77, LZ78, LZW, and LZRW1; (3) statistics-based coding methods, such as Shannon-Fano coding, Huffman coding (modified Huffman code), and arithmetic coding (binary arithmetic coding, and QM-coder); and (4) coding methods based on data transform, such as Burrows-Wheeler and predictive coding. If the parameters of the algorithms are modified in response to one or more characteristics of the input data, they are referred to as "adaptive;" otherwise, they are considered not adaptive and their parameters are fixed for the whole process of data coding.

Many different run-length coding methods have been developed. Run-length encoding algorithms are based on the observation that certain types of data files frequently contain the same character or digit repeated many times in a row. Digitized signals, for example, often have runs of the same value, indicating that the signal is not changing. In particular, run-length encoding for a data sequence often has frequent runs of zeros. Each time a zero is encountered in the input data, the algorithm writes two values to the output file. The first of these values is a zero, a flag to indicate that run-length compression is beginning. The second value is the number of zeros in the run. If the average run-length is longer than two, compression will take place. On the other hand, many single zeros in the data sequence can make the encoded file larger than the original. Run-length encoding can be used on only one of the characters (as with the zero above), several of the characters, or all of the characters. On the other hand, binary (black-and-white) images, such as standard facsimile transmissions, usually consist of runs of 0's or 1's. While the original binary data requires 65 bits for storage, its compact representation requires 32 bits only under the assumption that 4 bits are representing each length of run. The early facsimile compression standard algorithms were developed based on this principle.

The dictionary-based coding techniques are also often used for data compression. Most of the popular text compression algorithms use the dictionary-based coding approach. In dictionary coding, groups of consecutive input symbols (phrases) can be replaced by an index into some dictionary. Ziv and Lempel described dynamic dictionary encoders, popularly known as LZ77 and LZ78, by replacing the phrases with a pointer to where they have occurred earlier in the text. The LZW method achieves compression by using codes 256 through 4095 to represent sequences of bytes. The longer the sequence assigned to a single code, and the more often the sequence is repeated, the higher the compression achieved. Although this is a simple approach, there are two major obstacles that need to be overcome: (1) how to determine which sequences should be in the code table, and (2) how to provide the decompression program the same code table used by the compression program. The LZW algorithm exquisitely solves both these problems. When the LZW program starts to encode a file, the code table contains only the first 256 entries, with the remainder of the table being blank. This means that the first codes going into the compressed file are simply the single bytes from the input file being converted to 12 bits. As the encoding continues, the LZW algorithm identifies repeated sequences in the data, and adds them to the code table. Compression starts the second time a sequence is encountered. The key point is that a sequence from the input file is not added to the code table until it has already been placed in the compressed file as individual characters (codes 0 to 255). This is important because it allows the decompression program to reconstruct the code table directly from the compressed data, without having to transmit the code table separately.

LZ77, another dictionary-based coding approach, was the first form of Ziv-Lempel coding proposed by Ziv and Lempel in 1977. In this approach, a fixed-size buffer containing a previously encoded character sequence that precedes the current coding position can be considered as a dictionary. The encoder matches the input sequence through a sliding window. The window is divided into two parts: a search window that consists of an already encoded character sequence and a look-ahead buffer that contains the character sequence to be encoded. To encode the sequence in the look-ahead buffer, the search window is searched to find the longest match with a prefix of the look-ahead buffer. The match can overlap with the look-ahead buffer, but cannot be the buffer itself. Once the longest match is found, it is coded into a triple <offset, length, C(char)>, where offset is the distance of the first character of the longest match in the search window from the look-ahead buffer, length is the length of the match, and C(char) is the codeword of the symbol that follows the match in the look-ahead buffer.

LZ78 is the other key algorithm in the L-Z family, proposed by Ziv and Lempel in 1978. Instead of using the previously encoded sequence of symbols (or string) in the sliding window as the implicit dictionary, the LZ78 algorithm explicitly builds a dictionary of patterns dynamically at both the encoder and the decoder.

Turning to statistics-based coding methods, the Shannon-Fano algorithm is well-known for its simplicity. The algorithm makes use of the original messages m(i) and the corresponding probabilities for their appearance P(m(i)). The list is divided into two groups with approximately equal probability. Every message from a first group has "0" as the first code digit; every message from the second group has "1" as the first code digit. Each group is divided into two parts in a similar way and the second digit is added to the code. The process goes on until groups containing one message only are obtained. As a result, every message will have a corresponding code x with length $-\lg(P(x))$. It may be seen that while the Shannon-Fano algorithm is indeed simple, it does not guarantee optimum coding.

Another statistics-based coding technique is the Huffman Algorithm. To describe this algorithm, consider a group of messages $m(1), \ldots, m(n)$ that have probabilities $P(m(1)), \ldots P(m(n))$, and let them be arranged such that $P(m(1))>P(m(2))> \ldots >P(m(N))$. Then, let $x_1, \ldots, x_n$ be a set of binary codes with lengths $l_1, l_2, \ldots, l_N$. The task of the algorithm is to define the correspondence between $m(i)$ and $x_j$. It can be proven that for every set of messages there exists a binary code, in which the two codes with lowest probability $x_N$ and $x_{N-1}$ have the same length, and differ only by their last symbol: $x_N$ has a last bit of "1", and $x_{N-1}$ has a last bit of "0". The reduced set will have its two codes with lowest probability grouped together as well and the procedure continues in the same way until there remain only two messages.

Although Huffman coding is a very efficient entropy coding technique, it has several limitations. The Huffman code is optimal only if the exact probability distribution of the source symbols is known. It is also clear that each symbol is encoded with an integer number of bits. It is known from Shannon's theory that the optimal length of a binary codeword for a source symbol s from a discrete memoryless source is $-\log p(s)$, where $p(s)$ is the probability of appearance of symbol s. This condition is exactly satisfied when the probabilities of the source symbols are negative integer powers of two (e.g., $2^{-1}, 2^{-2}, 2^{-3}, 2^{-4}$, etc.). If the probabilities of the symbols significantly deviate from this ideal condition, encoding of these symbols can result in poor coding efficiency. The average code length less the entropy defines redundancy of a source. It can be shown that the redundancy of Huffman codes can be bounded by $p+0.086$, where p is the probability of the most likely symbol [a]. As a result, the redundancy will be very high if the probability of occurrence of a symbol is significantly greater compared to the others. Huffman coding is not efficient to adapt with the changing source statistics. Another limitation of Huffman coding is that the length of the codes of the least probable symbol could be very large to store into a single word or basic storage unit in a computing system. In the worst-case scenario, if the probability distribution of the symbols generates a Huffman tree that is a skewed binary tree, the length of the longest two codes will be $n-1$ if there are n source symbols. The Huffman tree for this source will be a skewed binary tree and the Huffman codes of a, b, c and d can be 1, 01, 001 and 000, respectively. Usually the Huffman codes are stored in a table called the Huffman table. In its simplest form of implementation, each entry in the table usually contains a Huffman code. Since the Huffman code is a variable-length code, the length of the longest code usually determines the storage of each entry into the code table. For an arbitrarily large code it is a limitation.

Turning now to arithmetic coding, the basic idea is to consider a symbol as digits of a numeration system, and text as decimal parts of numbers between 0 and 1. The length of the interval attributed to a digit (it is 0.1 for digits in the usual base 10 system) is made proportional to the frequency of the digit in the text. The encoding is thus assimilated to a change in the base of a numeration system. To cope with precision problems, the number corresponding to a text is handled via a lower bound and an upper bound, which remains to associate with a text a subinterval of [0,1]. The compression results from the fact that large intervals require less precision to separate their bounds.

The algorithms for arithmetic coding suffer from a number of limitations. First, the encoded value is not unique because any value within the final range can be considered as the encoded message. It is desirable to have a unique binary code for the encoded message. Second, the encoding algorithm does not transmit anything until encoding of the entire message has been completed. As a result, the decoding algorithm cannot start until it has received the complete encoded data. It may be noted that these first two limitations may be overcome by using binary arithmetic coding. A third limitation is that the precision required to represent the intervals grows with the length of the message. A fixed-point arithmetic implementation is desirable, which can again be achieved using the binary arithmetic coding by restricting the intervals using a scaling approach. Fourth, the use of multiplications in the encoding and decoding process, in order to compute the ranges in every step, may be computationally prohibitive for many real-time fast applications. Finally, the algorithm is very sensitive to transmission errors; a minor change in the encoded data could represent a completely different message after decoding.

Turning finally to coding methods based on data transform, the Burrows-Wheeler Transform (BWT) algorithm works with blocks of data and ensures efficient lossless data processing. The data block resulting from the transform has the same length as the original block, but another arrangement of the participating symbols. The algorithm is more efficient when the processed data block is longer. The algorithm performance may be explained for a limited input data volume (row S with length N). The row S is treated as a sequence of N rows. At first the row S is shifted so that to obtain the new $(N-1)^{st}$ row. In fact the number of rows is not increased but only a set of pointers aimed at a cycle buffer is created, where the initial row S is placed. After that follows the lexicographic arrangement of these pointers. The result of the application of the BWT algorithm is the row L and initial index, representing the number of the row element L, where the first symbol of the original row S is saved.

Predictive Transform (or DPCM) coding, another data transform technique, is based on the idea of coding each symbol in a memoryless fashion. The symbol is predicted on the basis of information that the decoder also possesses, then a prediction residual is formed, and it is coded. The decoder adds the decoded residual to its version of prediction.

It may be seen from this discussion that each of the prior art approaches for data compression have disadvantages. In particular, prior art lossless data compression techniques may, depending upon the data set, actually increase the volume of the data after compression. What is desired then is an improved lossless data compression method and apparatus that decreases or, at worst, does not significantly increase the data volume after compression for any conceivable data set.

SUMMARY OF THE INVENTION

The invention is directed to an apparatus and method for content-based run-length data encoding that overcomes the disadvantages of prior art lossless compression algorithms by limiting the increase in data size that may result from sub-optimal data sets. In particular, the invention never results in a data volume that is increased by more than one word, and in most cases, particularly with certain real-world data sets, the data volume is significantly decreased. In the first stage of the method, an input data sequence is transformed without significantly increasing its volume in order to obtain long sequences of identical digits. In the second stage, every such sequence is replaced with a unique shorter sequence. The compressed data is decoded performing corresponding inverse operations. The method is particularly efficient for compression of some important classes of digital files such as graphics, texts, signatures, and fingerprints.

In one aspect of the present invention, there is a method for contents-based run-length coding, comprising the steps of calculating the histogram of the input data; defining the single not-used values and the sequences of not-used values in the data histogram; defining the start value and the length of every such sequence or the positions of the single not-used values; defining the longest sequence and selection of the one with the smallest start value for further processing; transforming the input data with size-saving prediction (SSP) encoding; calculating the new data histogram and analysis, further data modification performed with subtraction of the most frequent value from every number in the processed sequence; preparation of the header of the processed data; and coding with data adaptive run-length encoding.

In another aspect of the invention, there is a method for decoding a coded data sequence, comprising the steps of header analysis; data adaptive run-length decoding; inverse data modification; SSP decoding; and final arrangement of the restored data.

In another aspect of the invention, there is an apparatus for contents-based run-length encoding, comprising a transform module operable to receive the input data and to return the calculated data histogram; a module operable to receive the input data sequence to process it with SSP encoding and to return a new data sequence; a module operable to receive the new data sequence and to calculate and analyze the histogram of the said data sequence and to return the calculated histogram and the analysis results; a module operable to receive the selected data sequence and to return it modified, subtracting the most frequent value from every number in the sequence; a module operable to receive the new data sequence, and to calculate and analyze the histogram of the said data sequence and to return the calculated histogram and the analysis results; and a module operable to receive the data sequence and to return it coded with data adaptive run-length encoding.

In another aspect of the invention, there is an apparatus for data decoding, comprising a module operable to receive the header of the coded data sequence and to return the result from the analysis of the coded data header; a module operable to receive the coded data and to return it decoded with data adaptive run-length decoding; a module operable to receive the decoded data and to return it processed with inverse modification, adding the most frequent value to every number on the sequence; a module operable to receive the inverse modified data and to return it processed with SSP decoding; and a module operable to receive the decoded data and to return it arranged and saved.

An important advantage of the present invention is that the data volume resulting from the use of the invention is never increased from the original data volume by more than one word, and in all other cases the data volume is significantly decreased.

Another advantage of the present invention is that it is suitable for different kinds of data, including graphic images (color or grayscale), texts, and facsimile transmissions.

Yet another advantage of the present invention is the low computational complexity of the algorithm, due to the fact that the processing does not require interpolations and decimations, multiplications or divisions.

Yet another advantage of the present invention is that the compression is adaptive according to the data contents.

Yet another advantage of the present invention is that the obtained encoded value is unique.

Yet another advantage of the present invention is that no coding table is required for decoding.

These and other features, objects and advantages of the present invention will become better understood from a consideration of the following detailed description of the preferred embodiments and appended claims in conjunction with the drawings as described following:

DRAWINGS

DETAILED DESCRIPTION OF THE PREFERRED EMBODIMENTS

Figure 1:
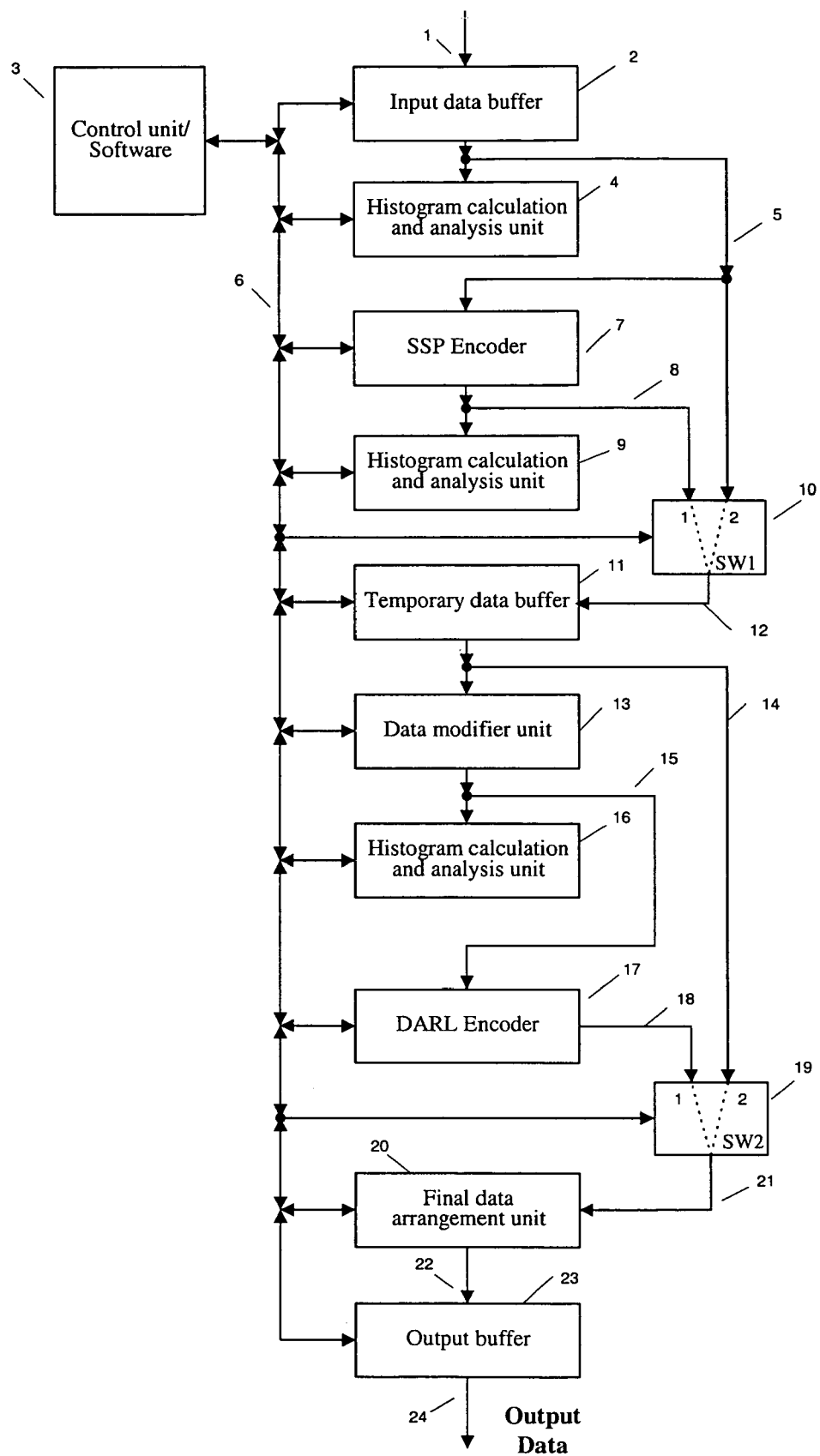
FIG. 1 is a block diagram showing an apparatus for contents-based run-length encoding (the coder) according to a preferred embodiment of the present invention.

The method for contents-based run-length encoding according to a preferred embodiment of the present invention is aimed at the compression of data, which is an N-dimensional sequence of n-bit binary words (numbers) with values in the range $(-2^{n-1}, 2^{n-1}-1)$. The coded data that is obtained as a result is a sequence of n-bit words as well. The method, generally speaking, comprises two consecutive stages. In the first stage, the input data is transformed in order to increase the compression to be performed in the second stage. The compression performed in the second stage is based on a run-length coding method. The result is that the input data sequence is replaced by a shorter one, which consists of a header (service data) and data, compressed in accordance with the method.

The transformation performed during the first stage of the method is carried out without increasing the data volume to ensure that sequences of equal numbers are obtained with maximum length. In particular, the values of the numbers in these sequences are equal to zero. The transform is reversible and is generally performed applying the following operations:

1. A histogram of the input data is calculated.
2. The not-used values and the sequences of not-used values (if there are any) in the histogram are identified.

For every sequence of not-used values, the start value and length of the sequence is defined.
3. The start value of the longest sequence of not-used values in the histogram is defined. If there is more than one sequence with the maximum length, then the one with the smallest start value is chosen for further processing.
4. The input data is transformed in accordance with a size-saving prediction SSP coding method. According to this coding method, every number from the input data sequence is replaced with its difference from the preceding number. If the result is outside the range of the input numbers, the sum of the current value and "1" is calculated, with a negative sign added to the result. In all other cases the difference between the current value and the preceding one is calculated and retained for further processing.
5. The histogram of the transformed data sequence is calculated.
6. The not-used values and the sequences of not-used values (if there are any) in this histogram are found. For every sequence of not-used values in the histogram, its start value and length are defined.
7. The start value of the longest sequence of not-used values in the histogram is defined. If there is more than one sequence with the maximum length, then the one with the smallest start value is chosen for further processing.
8. If sequences or single not-used values are not detected in either histogram, then a flag is set to indicate that the data is not suitable for processing in accordance with the method. In this case, the output sequence is the same as the input one. In all other cases, the coding continues in accordance with the following operations.
9. The start value of the longest sequence in the second histogram is defined. If there is more than one sequence with the maximum length, then the one with the smallest start value is chosen for further processing.
10. The more suitable data sequence is then selected for further processing, either the input data sequence or the sequence obtained after performing the SSP coding. The choice is made depending on the histogram analysis result, which indicates the availability of a single not-used value or of a sequence of such values in the histograms. The one with a longer sequence is preferred. If the second data sequence is more suitable, a flag is set to indicate this fact.
11. The most frequent value in the chosen sequence is then defined, that value being the number for which the corresponding histogram has a maximum. If the histogram has a maximum for more than one value, the smallest value is selected for further processing.
12. The difference between every number of the selected sequence and the most frequent value is calculated without carry.
13. A third histogram is calculated for the new data sequence, obtained after the calculation of the abovementioned differences, and the not-used values or sequences of not-used values are defined for this histogram.
14. The start value of the longest sequence of not-used values in the third histogram is defined. If there is more than one sequence with maximum length, the one with the smallest start value is selected for further processing.
15. A third flag is set to indicate whether a sequence of not-used values was found in the histogram. If a sequence of not-used values was not found, then the flag is set to a value of "0."

In the second stage of the method according to the preferred embodiment of the present invention, the header and transformed data from the first stage are coded. The header is necessary for the proper decoding of the compressed data. The header comprises a control word with the three already-mentioned control flags. It contains additional information as well, the content of which depends upon the value of the three control flags. When the first flag is set to "1", the header contains two numbers with additional information: the most frequent value in the transformed data sequence, and the start value of the longest sequence of not-used values in the histogram. If the histogram has only single not-used values, the second number of the additional information contains the smallest not-used value in the histogram. If the first two flags are set to "1," the header will contain one more additional number, which indicates the length of the sequence of not-used values, reduced by one. If the first flag is set to "0," then the header does not contain any additional information.

Once the header information is constructed in the preferred embodiment of the present invention, processing continues with the coding of the transformed data. If the first flag in the header is set to "1," then the transformed data sequence is compressed with "data-adaptive run-length" (DARL) encoding, a technique that will be explained in greater detail below. As a result, the volume of the transformed data obtained at the end of the first stage will be decreased. For this purpose, all sequences of same values are replaced with shorter ones. The particular steps performed using this type of encoding according to the preferred embodiment of the present invention are as follows:
1. Every sequence of zeros in the transformed data, whose length is smaller or equal than that of the longest sequence of not-used values in the histogram, is replaced by a number, where that number is equal to the sum of the start value of the sequence of not-used values and the length of the compressed sequence, reduced by one. When the sequence contains one zero only, run-length encoding is not performed.
2. Every sequence of zeros in the transformed data that is longer than the sequence of not-used values in the histogram but is shorter than $2^{mn}$ is represented with 2m words, n-bits each. Here, m is a number greater than or equal to 1. The first of these words contains the start value of the longest sequence of not-used values, the next (m−1) words contain zeros, and in the remaining m words is the length of the coded sequence, decreased by one.
3. Every sequence of same values, different from 0 and longer than 4, but shorter than $2^{mn}$, is replaced with (2m+2) words, n-bits each. The first word in the replacement sequence contains the start value of the longest sequence of not-used values, the second word contains the number "1", the next (m−1) words contains the number "0", and the last word contains the value of the number (different from 0) comprising the coded sequence. If the sequence of same values is different from 0 but is shorter than or equal to 4, then it is not coded with the new run-length encoding and therefore remains unchanged.
4. If the first flag is "0," then the transformed data sequence is not suitable for compression, and after the header the input data sequence is copied unchanged.

Continuing with a description of the preferred embodiment of the present invention, the decoding process is performed in a generally reciprocal fashion. The flags in the header control word are analyzed consecutively. If the first flag is set to "0", this indicates that the input data sequence had not been compressed and no decoding of the data is necessary. If the first flag is set to a value of "1," then the second flag (which indicates whether a sequence of not-used values was found in the histogram) is read. If the second flag is set to "0", that means that there were only single not-used values, and thus the additional header information comprises the most frequent value in the transformed data and the smallest not-used value in the corresponding histogram. If the flag is set to a value of "1", the additional header information comprises the most frequent value in the transformed data, the start value of the longest sequence of not-used values in the corresponding histogram, and the length of this sequence. From each word of the compressed data sequence following the header that number is subtracted that points at the start value of the longest sequence of not-used values. In correspondence with the obtained difference, the current word in the compressed data is replaced with a sequence of same numbers. The value of these numbers and the length of the restored sequence are defined as follows:

1. If the calculated difference is a negative number or a number that is larger than the length of the longest sequence of not-used values in the histogram of the transformed data, reduced by one, then the processed word from the compressed data is not changed and the restored data sequence is the same as the compressed one.
2. If the calculated difference is a positive number that is equal to or less than the length of the longest sequence of not-used values, then the processed coded word is replaced by a sequence of words, containing zeros, with length equal to the difference, increased by one.
3. If the calculated difference is zero, and the next word (following the currently processed one) in the compressed data is not zero, then these two words are replaced by a sequence of words containing only zeros, with length equal to the value of the second word, increased by one;
4. If the calculated difference is zero, the next (m−1) words are zeros, and after them follow m words different from zero, then the currently processed word, together with the next (2m−1) words, are replaced by a sequence of words, containing only zeros, with length equal to the number in the last m words of the data sequence, increased by one.
5. If the calculated difference is zero, the next word has a value of "1", and after that follows a word different from zero, then the currently processed word and the next three words are replaced by a sequence of same values, different from zero, with length equal to the number stored in the word after them, containing "1", increased by one, and with value equal to the value in the last word;
6. In the case that the calculated difference is zero, the next word contains "1," and after that follows a sequence of (m−1) words containing "0" and a sequence of m words different from zero, then the currently processed word and the next (2m−1) words are replaced by a sequence of words different from zero, with length equal to the number stored in the sequence of (m−1) words, increased by 1, and with value equal to the value in the last word of the sequence.

The result of this process as just described is a restored data sequence, which is the same as the one obtained at the end of the first stage of the coding, described above. As a next step, the most frequent value is added to every number in the data sequence without carry. The second flag in the header is then checked. If the flag has a value of "0," this indicates that the data sequence had not been coded with SSP encoding and thus the data sequence that was obtained is the same as the original one. Otherwise, the decoding process continues iteratively. If the arithmetic sum of the current word from the transformed data and the preceding one is above the range of the transformed data, then the currently decoded word is equal to the negative sum of the current word and the value "1"; in all other cases, the currently decoded word is equal to the arithmetic sum of the current word and the preceding one. When the decoding is finished, the decoded data sequence is the same as the initial one.

A more detailed description of the preferred embodiment of the present invention may now be described with reference to FIGS. 1-8. The preferred embodiment of the apparatus for contents-based run-length encoding in accordance with the preferred embodiment of the present invention is shown in FIG. 1, which is a block; diagram of the coder element of the preferred embodiment. It may preferable be implemented as a microprocessor unit with control software. Although the preferred embodiment is described in connection with logical structures, such logical structures may correspond to physical structures within or associated with such microprocessor, or may correspond to logical structures implemented by such microprocessor and related circuitry and software.

Data to be compressed is received at input 1 of input data buffer 2. Output 5 of input data buffer 2 is connected with first histogram calculation and analysis unit block 4, "size-saving prediction" (SSP) encoder block 7, and the second input of switching block 10 (SW1). Output 8 of the block 7 is connected with the input of second histogram calculation and analysis unit block 9 and with the first input of switching block 10. Output 12 of switching block 10 is connected with the input of temporary data buffer 11, where intermediate results are stored. Output 14 of data buffer 11 is connected with the input of data modifier unit block 13 and with the second input of switching block 19 (SW2). Output 15 of block 13 is connected with the input of third histogram calculation and analysis unit block 16 and with the input of "data-adaptive run-length" (DARL) encoder block 17. Output 18 of block 17 is connected with the first input of switching block 19. Output 21 of switching block 19 is connected with the input of final data arrangement unit block 20. Output 22 of block 20 is connected with the input of output buffer block 23, where the resulting compressed data sequence is stored. The output of block 24 is the output of the coder. Input 6 of blocks 2, 4, 7, 9, 10, 11, 13, 16, 17, 19, 20, and 23 is connected with the output of control unit/ software block 3.

Coding is performed using the preferred embodiment of the present invention as depicted in FIG. 1 as described following. The method is aimed at the compression of data, which is a N-dimensional sequence of n-bits binary words (numbers) $x_k$ for k=1, 2, ..., N, with values in the range $(-2^{n-1}) \leq x_k \leq (2^{n-1}-1)$. The method consists of two basic steps as already described. In the first step, the data is transformed for the purpose of increasing the degree of compression that results in the second stage. The data compression in the second stage is based on a run-length coding of the sequences of equal values. The result of coding the initial N-dimensional sequence is the substitution of the initial sequence with a shorter one, consisting of a header and data. The first stage of this process is performed at blocks 2, 4, 7, 9, 10, 11, 13, and 16 of FIG. 1. The whole performance is under the control of the microprocessor unit at block 3. The goal is to receive at input 1 the input data sequence $x_k$ for k=1, 2, . . . , N, and to transform this data into the sequence $v_k$ with same length N to obtain sequences with a maximum length of numbers having the same value, in particular the value zero. Together with this processing the additional header data is generated, which is necessary for the second stage of the coding. Referring to FIG. 1, the steps in this process proceed as follows:

1. The input data at input 1 is saved at input data buffer 2 and the histogram of the input data $x_k$ is analyzed at block 4. This requires the calculation of the histogram H(x) for $x=-2^{n-1}, -2^{n-1}+1, \ldots, -1, 0, 1, \ldots, 2^{n-1}-1$. Here H(x) is the number of values in the input sequence $x_k$, which are equal to x. The number L(x) is defined, representing the values in the histogram which are not used, and for which H(x)=0, when $x=-2^{n-1}, -2^{n-1}+1, \ldots, -1, 0, 1, \ldots, 2^{n-1}-1$:

$$L(x) = \sum_{x=-2^{n-1}}^{2^{n-1}-1} f(x) \text{ for } f(x) = \begin{cases} 1, & \text{if } H(x) = 0, \\ 0, & \text{if } H(x) \neq 0. \end{cases}$$

The positions $p_i = x_i$ are then defined, which point at the start positions of the intervals of not-used values. The lengths ($\Delta l_i + 1$) of these intervals in the histogram H(x) are defined as well, in correspondence with the relation:

$x \in [p_i, p_i + \Delta l_i]$ for $i=1, 2, \ldots, T(x)$, when $L(x) > 0$ and $H(x)=0$.

The interval of not-used (free) values with maximal length is defined as follows:

$p(x) = p_i$ and $l(x) = \Delta l_i = \max$ for $i=1, 2, \ldots, T(x)$.

If there is more than one interval of not-used values with maximal length, then l(x) corresponds to the one whose start position has smallest value.

2. The data $x_k$ is transformed into $y_k$ using the SSP algorithm at block 7, in correspondence with the relation:

$$y_k = \begin{cases} (x_k - x_{k-1}), & \text{if } (-2^{n-1}) \leq (x_k - x_{k-1}) \leq (2^{n-1} - 1), \\ -(x_k + 1) & \text{-in all other cases,} \end{cases}$$

for $k = 1, 2, \ldots, N$ and $x_0 = 0$.

As a result of this transformation, the sequences of same numbers in $x_k$ are become sequences of zeros in $y_k$.

3. The histogram of the data $y_k$ is then analyzed in block 9, as follows. First, the histogram H(y) is calculated for $y=-2^{n-1}, -2^{n-1}+1, \ldots, -1, 0, 1, \ldots, 2^{n-1}-1$, where H(y) is the number of values in the sequence $x_y$, which are equal to y. The number L(y) is defined, representing the values in the histogram that are not used, and for which H(y)=0, when $y=-2^{n-1}, -2^{n-1}+1, \ldots, -1, 0, 1, \ldots, 2^{n-1}-1$:

$$L(y) = \sum_{y=-2^{n-1}}^{2^{n-1}-1} f(y) \text{ for } f(y) = \begin{cases} 1, & \text{if } H(y) = 0, \\ 0, & \text{if } H(y) \neq 0, \end{cases}$$

The positions $p_i = y_i$ are defined, which point at the start positions of the intervals of not-used values. The lengths ($\Delta l_i + 1$) of these intervals in the histogram H(y) are defined as well, in correspondence with the relation:

$y \in [p_i, p_i + \Delta l_i]$ for $i=1, 2, \ldots, T(y)$, when $L(y) > 0$ and $H(y)=0$.

The interval of not-used values with maximal length is defined as follows:

$p(y) = p_i$ and $l(y) = \Delta l_i = \max$ for $i=1, 2, \ldots, T(y)$.

If there is more than one interval of not-used values with maximal length, then p(y) corresponds with the one whose start position has the smallest value.

4. The conditions L(x)=0 and L(y)=0 are next checked, which are satisfied only if there are no intervals of not-used values in the two histograms. The flag $F_{CBRL}$ (a bit of the control word) is set, which indicates whether the input data $x_k$ had been compressed as a result of the processing. If the conditions L(x)=0 and L(y)=0 are satisfied, the stage of the preliminary transform of the input data is stopped, the flag $F_{CBRL}$ is cleared, and the process goes on with the stage where the data coding is performed, but the coding ends without compression of the input data $x_k$. In all other cases, the flag $F_{CBRL}=1$, which indicates in the decoding process that the input data sequence had been compressed and the processing continues. This analysis is performed in the control unit 3. The selected data sequence is transferred for further processing by the switching block 10.

5. The more suitable data sequence $x_k$ or $y_k$ for k=1, 2, . . . , N is selected in accordance with:

$$y_k = \begin{cases} x_k; F_{SSP} = 0, H(y) = H(x), \\ L(y) = L(x), p(y) = p(x), l(y)|l(x), & \text{if } L(y) = 0 \text{ or } L(x) > 2^n - 4; \\ y_k; F_{SSP} = 1 & \text{-for SSP encoding.} \end{cases}$$

Here $F_{SSP}$ is a flag (a bit of the control word) that indicates the kind of the selected sequence; $F_{SSP}=1$ if the sequence $y_k$ is obtained with SSP encoding at block 7. This analysis is performed in the control unit 3. The selected data sequence is transferred for further processing by switching block 10.

6. The value y=r(y), is defined, for which the histogram H(y)=max, when $y=-2^{n-1}, -2^{n-1}+1, \ldots, -1, 0, 1, \ldots, 2^{n-1}-1$.

If H(y) has a maximum for more than one value of y, then r(y) corresponds with that one for which the value of y is smallest. This analysis is performed in the control unit 3.

7. The data sequence is modified in block 13, transforming every word of $y_k$ in $v_k$ subtracting r(y) without setting carry, in correspondence with the relation:

$$v_k = \begin{cases} [y_k - r(y)] & \text{if } [y_k - r(y)] \in [-2^{n-1}, 2^{n-1} - 1]; \\ [y_k - r(y)] - 2^n & \text{if } [y_k - r(y)] > 2^{n-1} - 1; \\ [y_k - r(y)] + 2^n & \text{if } [y_k - r(y)] < -2^{n-1}. \end{cases} \quad \text{for } k = 1, 2, \ldots, N.$$

8. The histogram of the data sequence $v_k$ is next analyzed at block 16. First, the histogram $H(v)$ for $v = -2^{n-1}$, $-2^{n-1}+1, \ldots, -1, 0, 1, \ldots, 2^{n-1}-1$ is calculated, where $H(v)$ is the count of the numbers with value v. Then, the number $L(v)$ of the not-used histogram values is calculated, where $H(v)=0$ for $v = -2^{n-1}, -2^{n-1}+1, \ldots, -1, 0, 1, \ldots, 2^{n-1}-1$:

$$L(v) = \sum_{v=-2^{n-1}}^{2^{n-1}-1} f(v) \text{ for } f(v) = \begin{cases} 1, & \text{if } H(v) = 0, \\ 0, & \text{if } H(v) \neq 0 \end{cases}$$

The positions $p_i = v_i$ are defined, which indicate the start positions of the intervals of not-used values. The lengths $(\Delta l_i + 1)$ of these intervals in the histogram $H(v)$ are defined as well, in correspondence with the relation:

$v \in [p_i, p_i + \Delta l_i]$ for $i = 1, 2, \ldots, T(v)$, when $H(v) = 0$.

The interval of not-used values with maximal length is defined as follows:

$p(v) = p_i$ and $l(v) = \Delta l_i = \max$ for $i = 1, 2, \ldots, T(v)$.

If there is more than one interval of not-used values with maximum length, $p(v)$ belongs to the one whose start position has the smallest value.

9. The flag $F_{SEQ}$ is set in accordance with the length $[l(v)+1]$ of the interval of not-used values, as follows:

$$F_{SEQ} = \begin{cases} 1, & \text{if } l(v) > 0; \\ 0, & \text{if } l(v) = 0. \end{cases}$$

The flag $F_{SEQ}$ thus indicates whether the length of the interval of not-used values is greater than 1. This analysis is performed in the control unit block 3. With this, the first stage of processing is complete. The result obtained is the transformed data sequence $v_k$ for $k=1, 2, \ldots, N$ and the additional information, comprising $r(y)$, $p(v)$ and $l(v)$, which are used in the second stage of the coding.

The operations of the second stage of encoding are represented in blocks 17, 19, 20 and 23 from FIG. 1. The whole performance is under the control of control. unit/software block 3. The basic operations, performed in accordance with the method, begin with the construction of the header for the output data stream. The header is necessary for the proper decoding of the compressed data and consists of control word $w_{00}$, comprising the three control flags $F_{CBRL}$, $F_{SSP}$ and $F_{SEQ}$. When $F_{CBRL}=0$, the header does not contain additional information. When $F_{CBRL}=1$, the header contains additional information, comprising the numbers $w_{01}=r(y)$ and $w_{02}=p(v)$. The first one, $r(y)$, is the most frequently met value in the data sequence $y_k$, and the second one, $p(v)$, is the start position of the first found interval of not-used values with maximum length in the data sequence $v_k$. When $F_{CBRL}=1$ and $F_{SEQ}=1$, the additional information in the header is increased with one more number $w_{03}=l(v)$, which defines the length of the interval with start position $p(v)$, reduced by 1. This analysis is performed in the control unit/software 3.

If $F_{CBRL}=1$, then the transformed data is compressed with DARL encoding. The result of this processing is that the volume of the transformed data $v_k$ obtained from the input sequence $x_k$ at the end of the first stage is decreased. For this, every sequence of numbers with same value in $v_k$ is replaced by the shorter one, $w_s$. This operation is performed at block 17 according to the following steps:

1. Every sequence of zeros $v_d = v_{d+1} = \ldots = v_{d+P-1} = 0$ with length P in the range $1 < P \leq l(v)+1$ that was detected in $v_k$ is replaced by one n-bit word $w = p(v) + P - 1$, i.e.:

$(v_d, v_{d+1}, \ldots, v_{d+P-1}) \Rightarrow (w = p(v) + P - 1)$. If $P=1$, then the sequence contains one zero only, $v_d = 0$, and run-length coding is not performed.

2. Every zero sequence $v_d = v_{d+1} = \ldots = v_{d+P-1} = 0$ with length P in the range $2^{mn} \geq P > l(v) + 1$ for $m \geq 1$ that was detected in $v_k$ is replaced by 2m words, n-bits each. In the first word is stored $p(v)$, in the next (m-1) words is stored zero, and in the remaining m words—the number (P-1), i.e.:

$(v_d, v_{d+1}, \ldots, v_{d+P-1}) \Rightarrow (w_1 = p(v), w_2 = 0, \ldots, w_m = 0, w_{m+1} = P_1, \ldots, w_{2m} = P_m)$, where the sequence $P_1, \ldots, P_m$ represents the number (P-1), stored in m words, n-bits each (here $P_1$ is the Most Significant Word, MSW, ... and $P_m$—the Least Significant Word, LSW).

3. Every sequence of same numbers, not equal to zero $v_d = v_{d+1} = \ldots = v_{d+P-1} = v$, with length P in the range $2^{mn} \geq P > 4$ for $m \geq 1$ that was detected in $v_k$ is replaced by (2m+2) words, n-bits each. In the first two words are stored $p(v)$ and "1", in the next (m-1) words—zeros, in the next m words—the number (P-1) and in the last word—the number, which is different from zero, i.e.:

$(v_d, v_{d+1}, \ldots, v_{d+P-1}) \Rightarrow (w_1 = p(v), w_2 = 1, w_3 = 0, \ldots, w_{m+1} = 0, w_{m+2} = P_1, \ldots, w_{2m+1} = P_m, w_{2m+2} = v)$, where the sequence $P_1, \ldots, P_m$ represents the number (P-1), presented with m words n-bits each (here $P_1$ is the MSW, ... and $P_m$—the LSW).

It may be noted that sequences of non-zero values with length $P \leq 4$ are not processed with DARL encoding. The result of this processing of $v_k$ is the compressed sequence $w_s$ for $s=1, 2, \ldots, S$ and $(-2^{n-1}) \leq w_s \leq (2^{n-1}-1)$. Here S is the number of the words in the sequence $w_s$, which is smaller than the total count N of the words in the input sequence $x_k$, if compression had been performed. The data sequence $x_k$, obtained as a result of the coding, is transferred through switching block 19 into final data arrangement unit block 20 and after that to output buffer 23.

The foregoing explanation provides for the circumstances where $F_{CBRL}=1$. If, on the other hand, $F_{CBRL}=0$, then the input sequence $x_k$ is not compressed, and after the header follows the data $w_s = x_k$ for $s=k=1, 2, \ldots, N$ (S=N). The data sequence $x_k$ is transferred through switching block 19 into final data arrangement unit block 20 and then through output buffer block 23.

Figure 3:
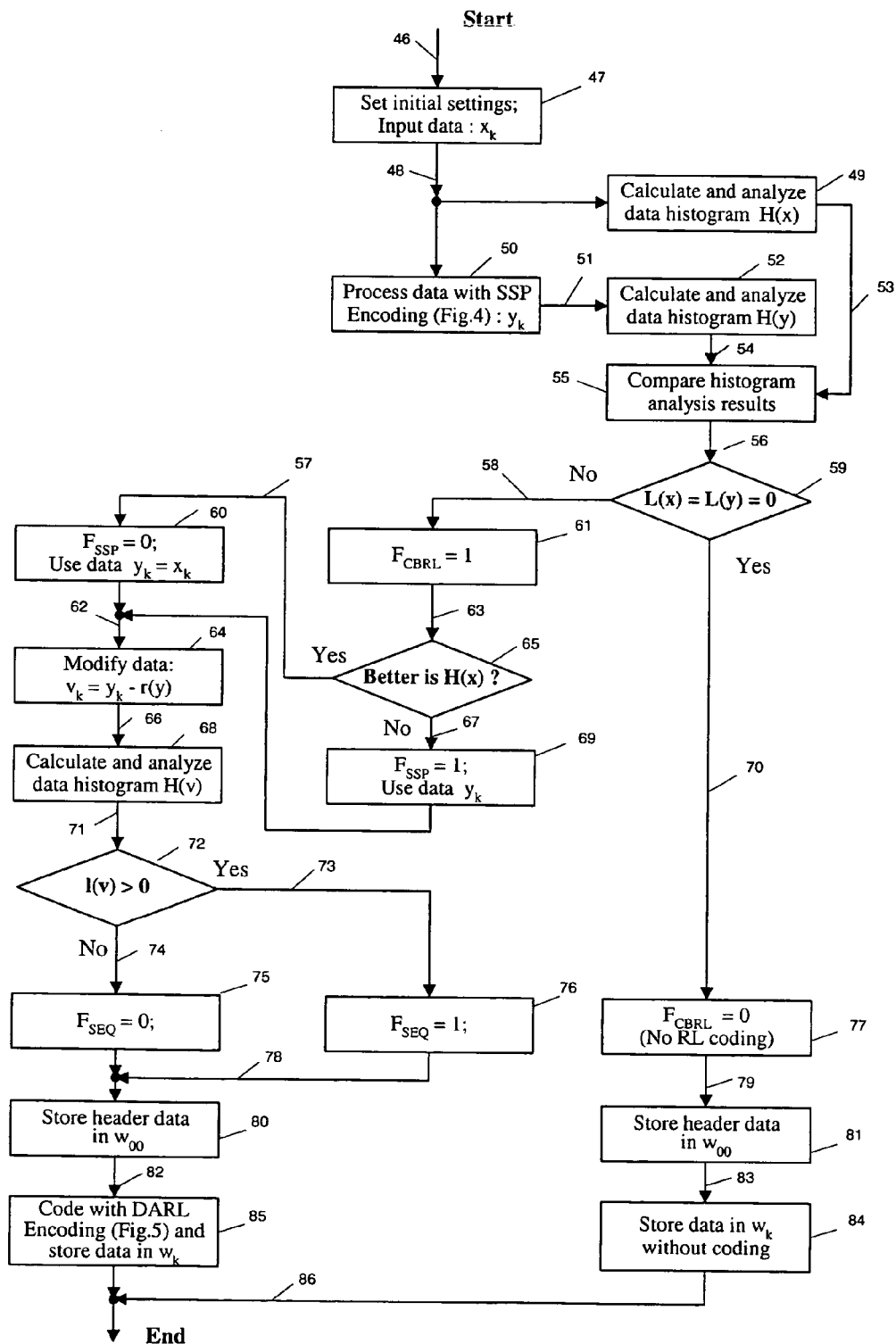
FIG. 3 is a block diagram of a first portion of a coding algorithm according to a preferred embodiment of the present invention.
Figure 4:
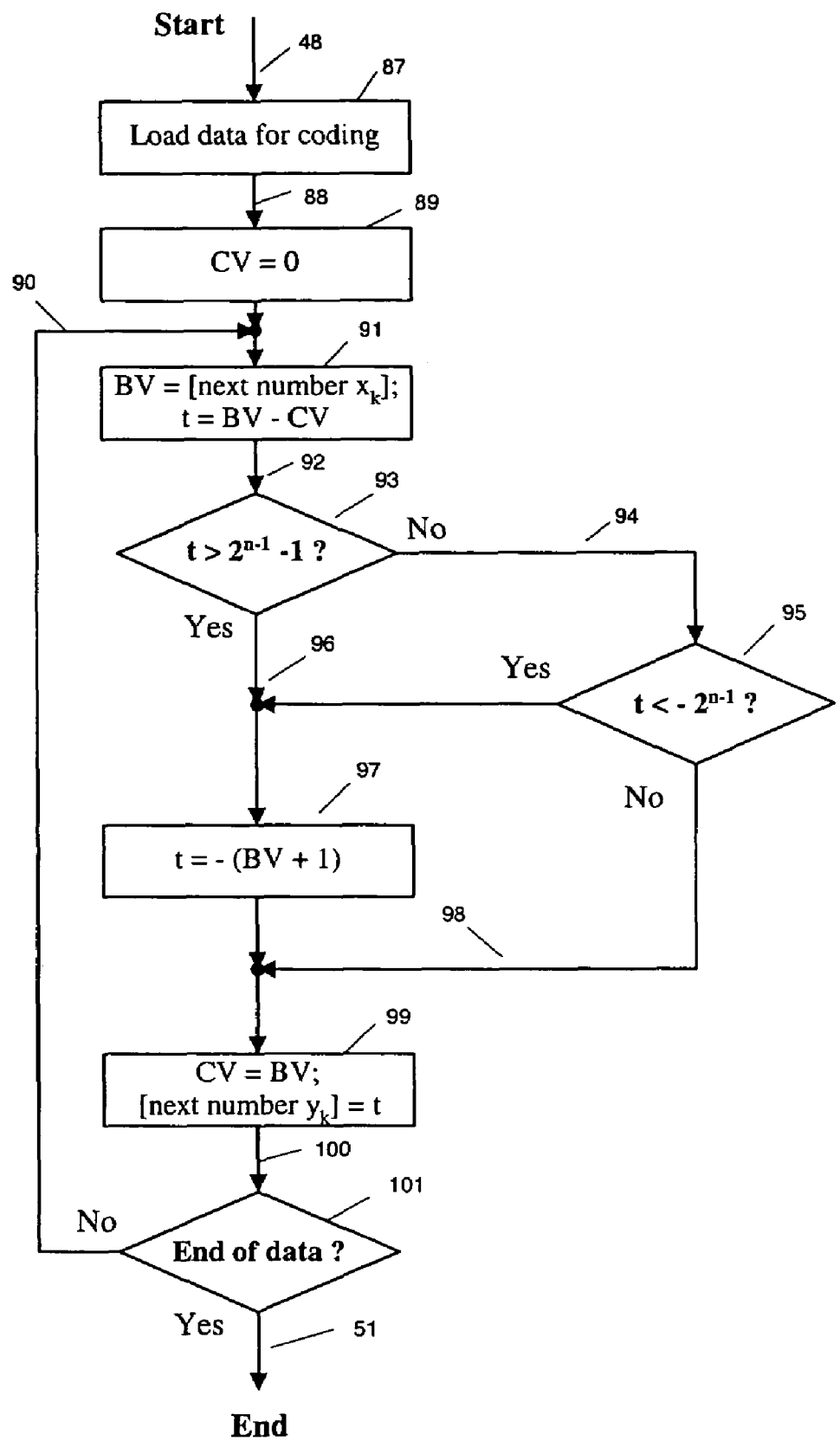
FIG. 4 is a block diagram of a second portion of a coding algorithm according to a preferred embodiment of the present invention.
Figure 5:
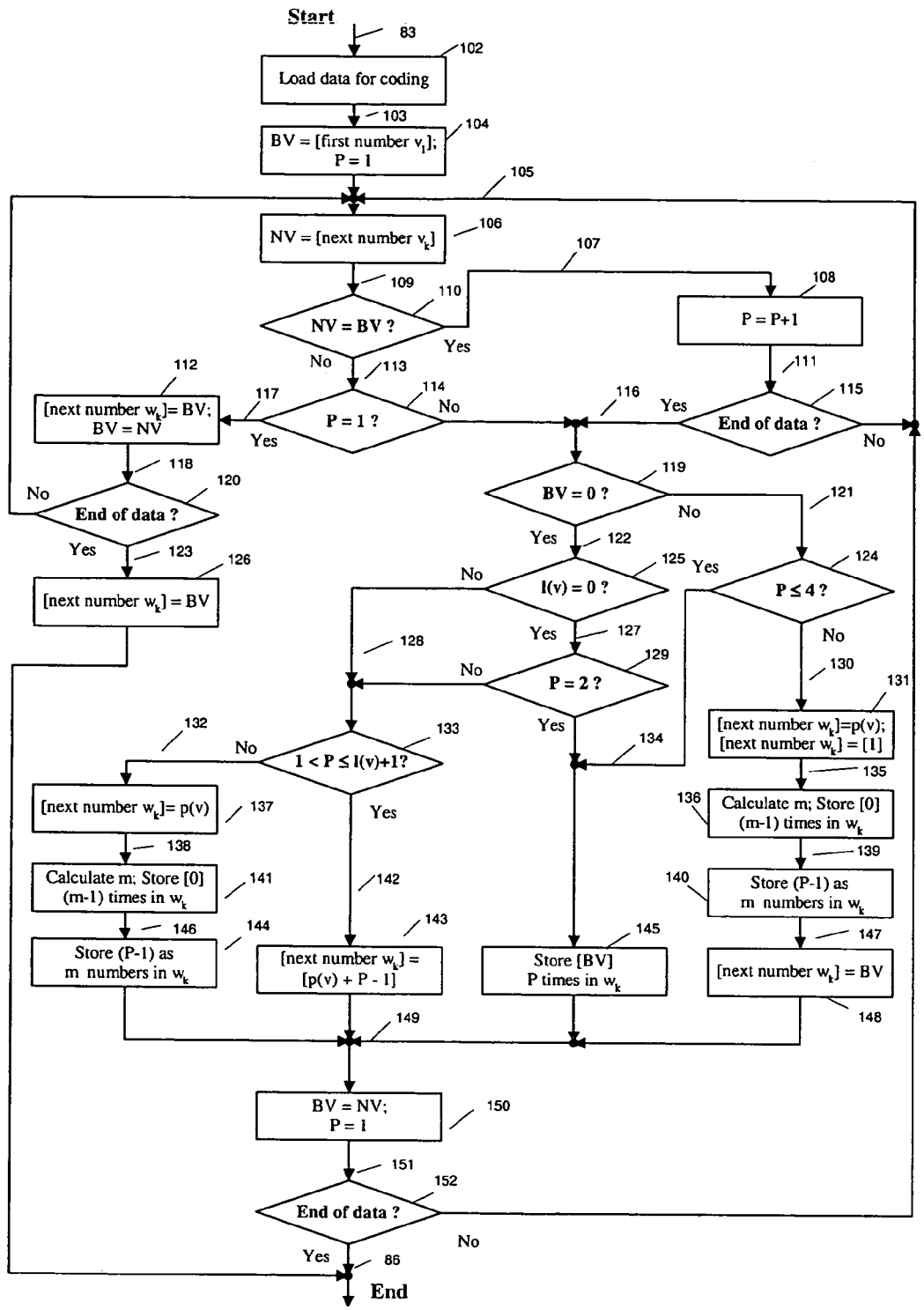
FIG. 5 is a block diagram of a third portion of a coding algorithm according to a preferred embodiment of the present invention.

The detailed block diagram of the algorithm of the coder in accordance with the already described method is presented in FIGS. 3, 4, and 5. In FIG. 3, the original input data enters at input 46 of the block for storage and setting the initial conditions 47. This block comprises the memory used to store the input data and to compose the start conditions for the processing. The output 48 of the last block is connected with the input of the block 49 for calculation and analysis of the data histogram and with the input of the block 50 for SSP encoding. The output 51 of block 50 is connected with the input of block 52 for calculation and analysis of the histogram of the data sequence, obtained after the SSP encoding. The output 54 of the last block is connected with the first input of block 55 for comparison of the two histograms, and the second input 53 of the same block 55 is connected with the output of block 49. The output 56 of block 55 is connected with the input of block 59, where it is determined whether there was detected a single not-used value or a sequence of not-used values in one of the two histograms. The output 58 (the "no" output) of this block is connected with the input of block 61 where the flag $F_{CBRL}$ is set to "1". The output 63 of the block 61 is connected with the input of block 65, where, depending upon the histogram analysis result, the system decides which data sequence is more suitable for the encoding. The output 57 (the "yes" output) of the block 65 is connected with the input of block 60, where the flag $F_{SSP}$ is set to "0" and the initial data sequence is prepared for further processing. The output 62 of block 60 is connected with the input of block 64 and with the output of block 69, where flag $F_{SSP}$ is set to "1" and the data sequence is prepared the further processing, having been obtained after the SSP coding. Output 67 (the "no" output) of block 65 is connected with the input of block 69. Output 66 of block 64 for data modification is connected with the input of block 68 for calculation and analysis of the modified data histogram. Output 71 of block 68 is connected with the input of block 72 where the system checks if there are sequences of not-used values in the modified data histogram. Output 73 (the "yes" output) of block 72 is connected with the input of block 76 where the flag $F_{SEQ}$ is set to "1". Output 74 (the "no" output) of block 72 is connected with the input of block 75, where the flag $F_{SEQ}$ is set to "0". Output 78 of block 75 is connected with the input of block 80 and with the output of block 76. Output 82 of block 80, where the header of the coded data is arranged and stored, is connected with the input of block 85 for data-adaptive, run-length encoding. Output 70 (the "yes" output) of block 59 is connected with the input of block 77, where the flag $F_{CBRL}$ is set to "0." Output 79 of block 77 is connected with the input of block 81, where the header of the coded data is arranged and stored. Output 83 of block 81 is connected with the input of block 84 for storing data without coding. Output 86 of block 84 is connected with the output of block 85 for data encoding and storage.

That part of the coder that provides SSP encoding is depicted in the flow chart of FIG. 4. The data enters input 48 of block 87, where data is stored and prepared for coding. Output 88 of block 87 is connected with the input of block 89 where the currently read value (CV) is initially set to "0". Output 90 of block 89 is connected with the output of block 101 (the "no" output) and with the input of block 91, where is calculated the difference between the buffer value (BV), corresponding with the next number of the data sequence and the current value (CV). Output 92 of block 91 is connected with the input of block 93, where the system checks if the value of the calculated difference is bigger than $(2^{n-1}-1)$. Output 96 (the "yes" output) of block 93 is connected with the first output ("yes" output) of block 95 and with the input of block 97, where the calculated value is set. Output 94 (the "no" output) of block 93 is connected with the input of block 95, where the system checks if the value of the calculated difference is smaller than $(-2^{n-1})$. Output 98 (the "no" output) of block 95 is connected with the output of block 97 and with the input of block 99, where the next value of the coded sequence is prepared. Output 100 of block 99 is connected with the input of block 101, where the system checks whether all the data has already been coded. At output 51 (the "yes" output) of block 101 the coded data is obtained.

The preferred embodiment of the present invention for the DARL encoding is presented with the block diagram of FIG. 5. Here the modified data sequence, obtained after the already described SSP encoding and data modification, passes through input 83 into the corresponding buffer (memory) block 102. Output 103 of the last block is connected with the input of block 104, where the buffer value (BV) is placed. Output 105 of this block is connected with the input of block 106, where the next value (NV) for processing is placed, with the first output (the "no" output) of block 115, with the first output (the "no" output) of block 120, and with the first output (the "no" output) of block 152. Output 109 of block 106 is connected with the input of block 110 where the system checks whether the new and the preceding number values are equal. Output 107 (the "yes" output) of block 110 is connected with the input of block 108, where the length of same values in the processed data sequence is counted. Output 111 of block 108 is connected with the input of block 115, where the system checks whether the whole data sequence had already been processed. Output 116 (the "yes" output) of block 115 is connected with the input of block 119, where the system checks whether the current value is zero, and with the first output (the "no" output) of block 114, where the system checks whether the length of the sequence of same values is equal to 1. Second output 113 (the "no" output) of block 110 is connected with the input of block 114. Second output 117 (the "yes" output) of block 114 is connected with the input of block 112, where the next number for processing is loaded. First output 121 (the "no" output) of block 119 is connected with the input of block 124 where the system checks whether the length of same values, different from zero, is equal to or less than 4. Second output 122 (the "yes" output) of block 119 is connected with the input of block 125, where the system checks whether the length of the sequence of not-used values in the data histogram is equal to 0. First output 127 (the "yes" output) of block 125 is connected with the input of block 129, where the length of the sequence of not-used values in the data histogram is checked to see if it is equal to 2. First output 134 (the "yes" output) of block 129 is connected with the second output (the "yes" output) of block 124 and with the input of block 145, where the value stored in the buffer is saved a number of times corresponding to the length of the sequence. Output 130 (the "no" output) of block 124 is connected with the input of block 131, whose output 135 is connected with the input of block 136. Output 139 of block 136 is connected with the input of block 140, whose output 147 is connected with the input of block 148.

In blocks 131, 136, 140, and 148, coding operations are performed in accordance with the described method. Output 149 of block 148 is connected with the outputs of blocks 145, 143, and 144 and with the input of block 150, where the final data arrangement is performed. Output 118 of block 112 is connected with the input of block 120, where it is determined whether all of the data has been processed. Second output 123 (the "yes" output) of block 120 is connected with the input of block 126, where the value stored in the buffer is set to be equal with that of the next number from the processed sequence. Output 86 of block 126 is connected with the second output (the "yes" output) of block 152, where it is determined whether the whole data sequence had already been processed. Output 86 is the output of the block for DARL encoding as well. Input 151 of block 152 is connected with the output of block 150. Second output 128 (the "no" output) of block 125 is connected with the second output (the "no" output) of block 129 and with the input of block 133, where it is determined whether the length of the sequence of same values is smaller than that of the sequence of not-used values in the data histogram. First output 142 (the "yes" output) of block 133 is connected with the input of block 143, where the length of the zero sequence is saved as a number in the sequence of not-used values. Second output 132 (the "no" output) of block 133 is connected with the input of block 137. Output 138 of block 137 is connected with the input of block 141, whose output 146 is connected with the input of block 144. In blocks 137, 141, and 144, the coding of a zero sequence whose length is larger than that of the sequence of not-used values in the data histogram is performed.

The decoding of the sequence $w_s$ processed with DARL encoding is performed in the preferred embodiment of the present invention according to the following steps:

1. The flags in the control word of the header woo are analyzed consecutively. If flag $F_{CBRL}=0$, this means that the input data sequence $x_k$ had not been coded in accordance with the DARL method (because it was not suitable for this particular data), and thus the decoded data $u_s$ is connected with $w_s$ with the relation $u_s=w_s$ for s=1, 2, 3, ..., S (S=N). The decoded data is defined in accordance with the relation $u_k=w_k=x_k$ for k=s=1, 2, ..., N, and with this the decoding ends. If flag $F_{CBRL}=1$, then the additional steps listed below are performed.

2. If $F_{SEQ}=1$, then additional information is read from the header of the compressed sequence $w_s$. This information includes the numbers $r(y)=w_{01}$, $p(v)=w_{02}$, and $l(v)=w_{03}$. If $F_{SEQ}=0$, the additional information comprises only the numbers $r(y)=w_{01}$ and $p(v)=w_{02}$ (for the decoding $l(v)=0$). After that, every value of $w_s$ for s=1, 2, ..., S and $F_{SEQ}=0$ is compared with the number $p(v)$. Depending upon the difference $\delta_s=w_s-p(v)$ when the value of $w_s$ is decoded, it is either retained or replaced by a sequence of numbers with the same value $v_p=v$ for p=1, 2, ..., P in correspondence with one of the followings procedures:

when $\delta_s>l(v)$ or $\delta_s<0$, the value of $w_s$ is not changed. In this case the replacement $w_s \Rightarrow (v=w_s)$ is performed;

when $0<\delta_s<l(v)$, the value of $w_s$ is replaced by the sequence $v_p$, consisting of zeros only, with length $P=w_s-p(v)+1$, and then $w_s \Rightarrow (v_1=0, v_2=0, ..., v_P=0)$;

when $\delta_s=0$ and $w_{s+1} \neq 0$, the data $w_s$ and $w_{s+1}$ are replaced by the sequence $v_p$, consisting of zeros only, with length $P=w_{s+1}+1$, and as a result $(w_s, w_{s+1}) \Rightarrow (v_1=0, v_2=0, ..., v_P=0)$ is obtained;

when $\delta_s=0$, $w_{s+1}=0, ..., w_{s+m-1}=0$, and $w_{s+m} \neq 0, ..., w_{s+2m-1} \neq 0$, the data $w_s$ to $w_{s+2m-1}$ are replaced by the sequence $v_p$, consisting of zeros only, with length $P=(w_{s+m}, ..., w_{s+2m-1})+1$. Here $w_{s+m}$ is the MSW and correspondingly $w_{s+2m-1}$ is the LSW. As a result, $(w_s, ..., w_{s+2m-1}) \Rightarrow (v_1=0, v_2=0, ..., v_P=0)$ is obtained;

when $\delta_s=0$, $w_{s+1}=1$, and $w_{s+2} \neq 0$, the numbers in the sequence from $w_s$ to $w_{s+3}$ are replaced by the sequence $v_p$, consisting of the non-zero numbers $v=w_{s+3}$ with length $P=w_{s+2}+1$. As a result, $(w_s, ..., w_{s+3}) \Rightarrow (v_1=v, v_2=v, ..., v_P=v)$ is obtained;

when $\delta_s=0$, $w_{s+1}=1$, $w_{s+2}=0, ..., w_{s+m}=0$, and $w_{s+m+1} \neq 0, ..., w_{s+2m} \neq 0$, the numbers in the sequence from $w_s$ to $w_{s+2m+1}$ are replaced by the sequence $v_p$, consisting of the non-zero numbers $v=w_{s+2m+1}$ with length $P=(w_{s+m+1}, ..., w_{s+2m})+1$. Here, $w_{s+m+1}$ is the MSW, and $w_{s+2m}$ is the LSW. As a result, $(w_s, ..., w_{s+2m-1}) \Rightarrow (v_1=v, v_2=v, ..., v_P=v)$ is obtained.

At the end of this step, the decoded sequence $v_k$, which contains N numbers, is obtained.

3. Inverse data modification is next performed, transforming every word $v_k$ in $y_k$ adding $r(y)$ to its value without carry, in accordance with the relations:

$$y_k = \begin{cases} [v_k + r(y)] & \text{if } [v_k + r(y)] \in [-2^{n-1}, 2^{n-1}-1]; \\ [v_k + r(y) - 2^n] & \text{if } [v_k + r(y)] > 2^{n-1}-1; \quad \text{for } k=1, 2, ..., N; \\ [v_k + r(y) + 2^n] & \text{if } [v_k + r(y)] < -2^{n-i}. \end{cases}$$

4. The flag $F_{SSP}$ is next checked. If $F_{SSP}=0$, then the sequence $x_k$ had not been SSP coded and then $u_k=x_k=y_k$ for k=1, 2, ..., N. If $F_{SSP}=1$; it is necessary to perform a transformation of $y_k$ in $u_k$ using SSP decoding, according to the equation:

$$u_k = \begin{cases} (y_k + u_{k-1}), & \text{if } 2^{n-1} \leq (y_k + u_{k-1}) \leq (2^{n-1}-1), \\ -(y_k + 1) & \text{-in all other cases.} \end{cases}$$

$$\text{for } k=1, 2, ..., N \text{ and } u_0=0.$$

Then $u_k=x_k$ and the decoding of $w_s$ is complete.

Figure 2:
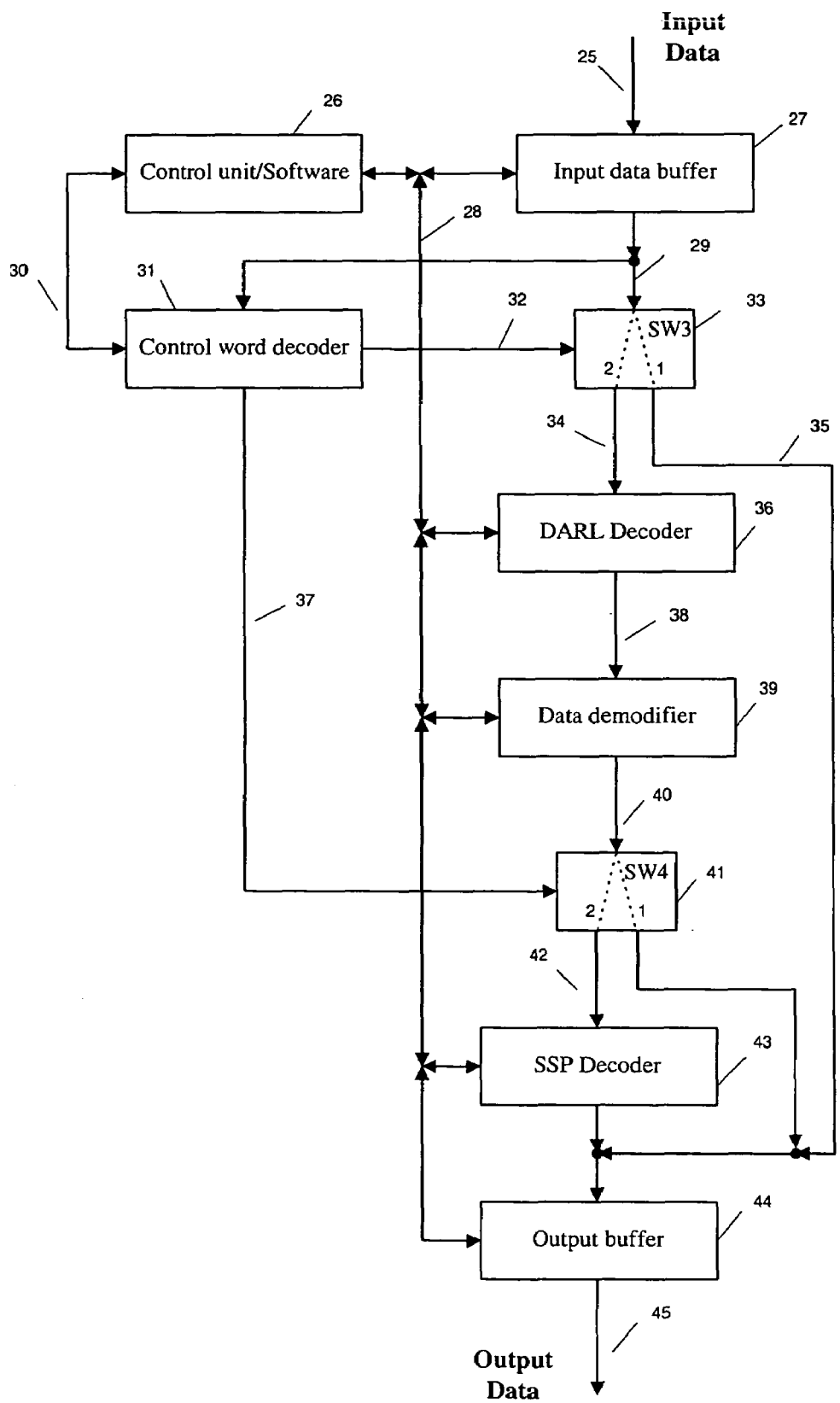
FIG. 2 is a block diagram showing an apparatus for data decoding (the decoder) according to a preferred embodiment of the present invention.

The preferred embodiment of the apparatus for contents-based run-length decoding in accordance with the invention is depicted in FIG. 2, which is a block diagram of the logical structure of the decoder element. It consists of a microprocessor block with control software, a block for input buffer memory, a control word decoder, two switching blocks, a block for DARL decoding, a block for data inverse modification, a block for SSP decoding, and a second memory block where the prepared decoded data is stored. In correspondence with the block diagram of FIG. 2, the coded input signal is applied at input 25 of input data buffer (memory) 27, whose output 29 is connected with the corresponding inputs of control word decoder 31 and of switching block 33 (SW3). Second output 34 of switching block 33 is connected with the input of DARL decoder 36, whose output 38 is connected with the input of block 39 for inverse data modification. Output 40 of block 39 is connected with the input of second switching block 41 (SW4). Second output 42 of switching block 41 is connected with the input of SSP decoder block 43, whose output 35 is connected with the first output of switching block 41, with the first output of switching block 33 and with the input of output buffer 44. The control inputs of input data buffer 27, of DARL decoder 36, of the block for inverse data modification 39, of SSP decoder 43, and of output buffer 44 are connected with output 28 of control unit/software block 26. The control input of switching block 33 is connected with output 32 of control word decoder 31. The control input of switching block 41 is connected with output 37 of control word decoder 31. Control word decoder 31 and the block for control unit/software 26 are connected by means of two-way connection 30. Output 45 of block 44 is the output of the decoder section.

Figure 6:
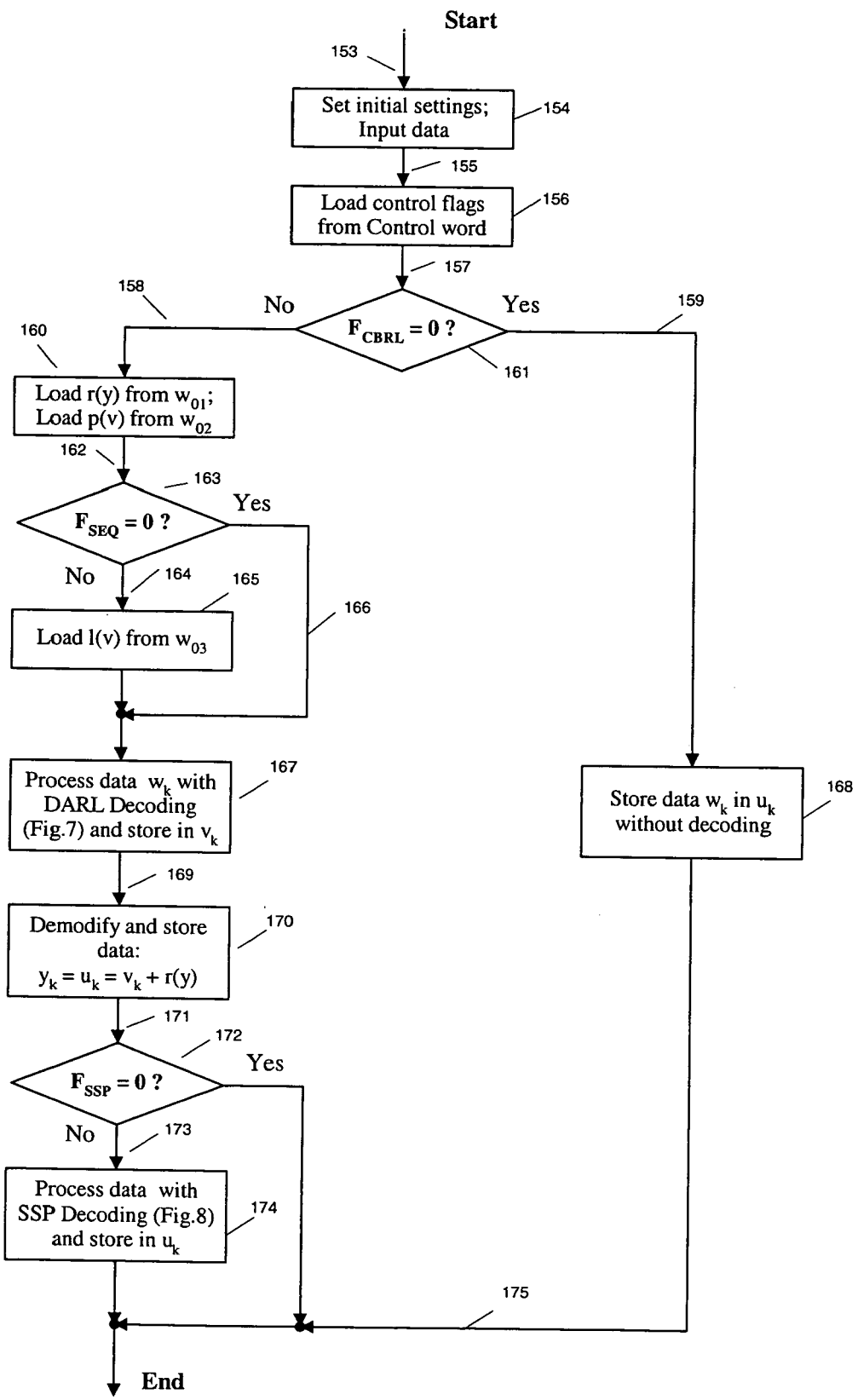
FIG. 6 is a block diagram of a first portion of a decoding algorithm according to a preferred embodiment of the present invention.
Figure 7:
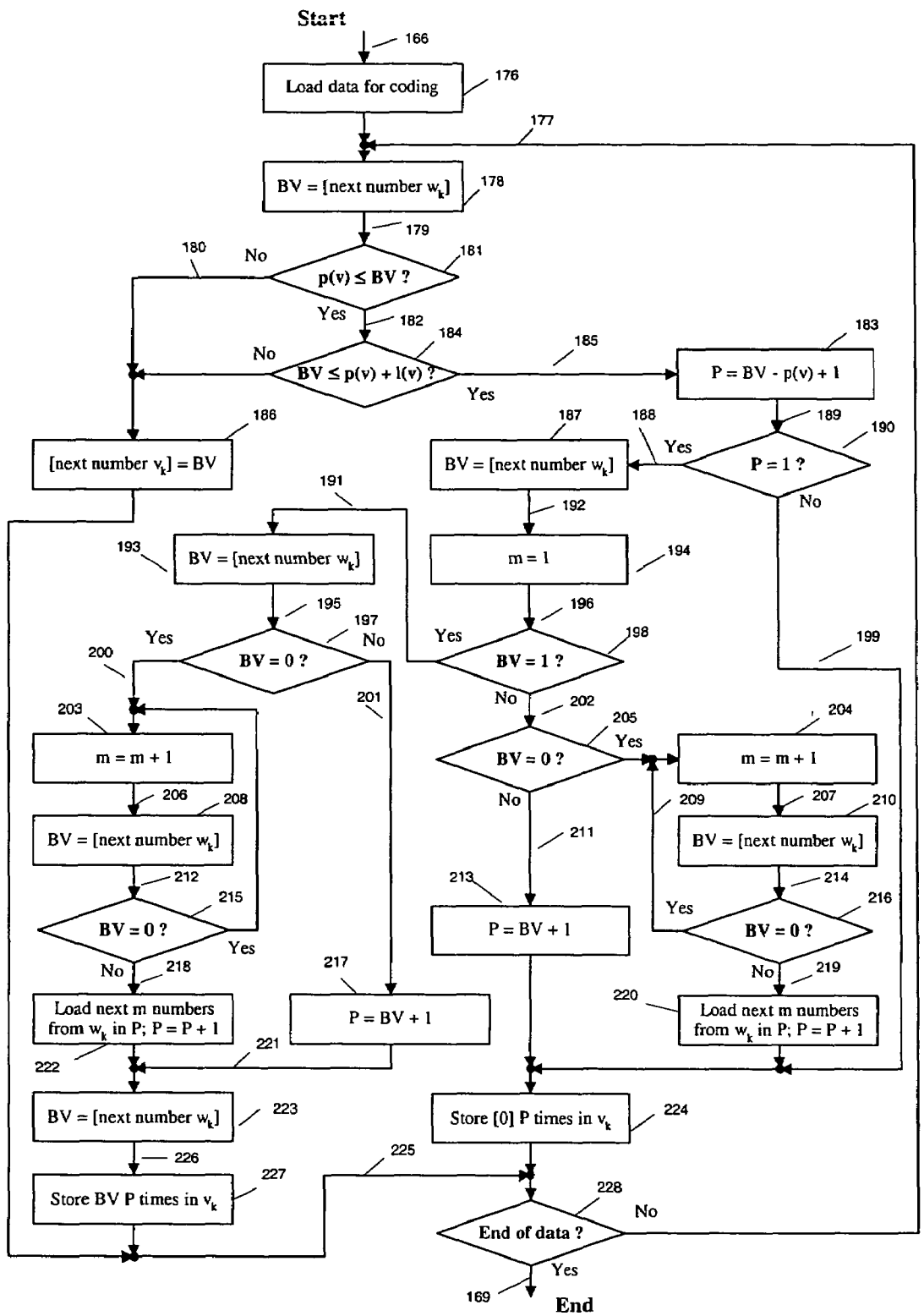
FIG. 7 is a block diagram of a second portion of a decoding algorithm according to a preferred embodiment of the present invention.
Figure 8:
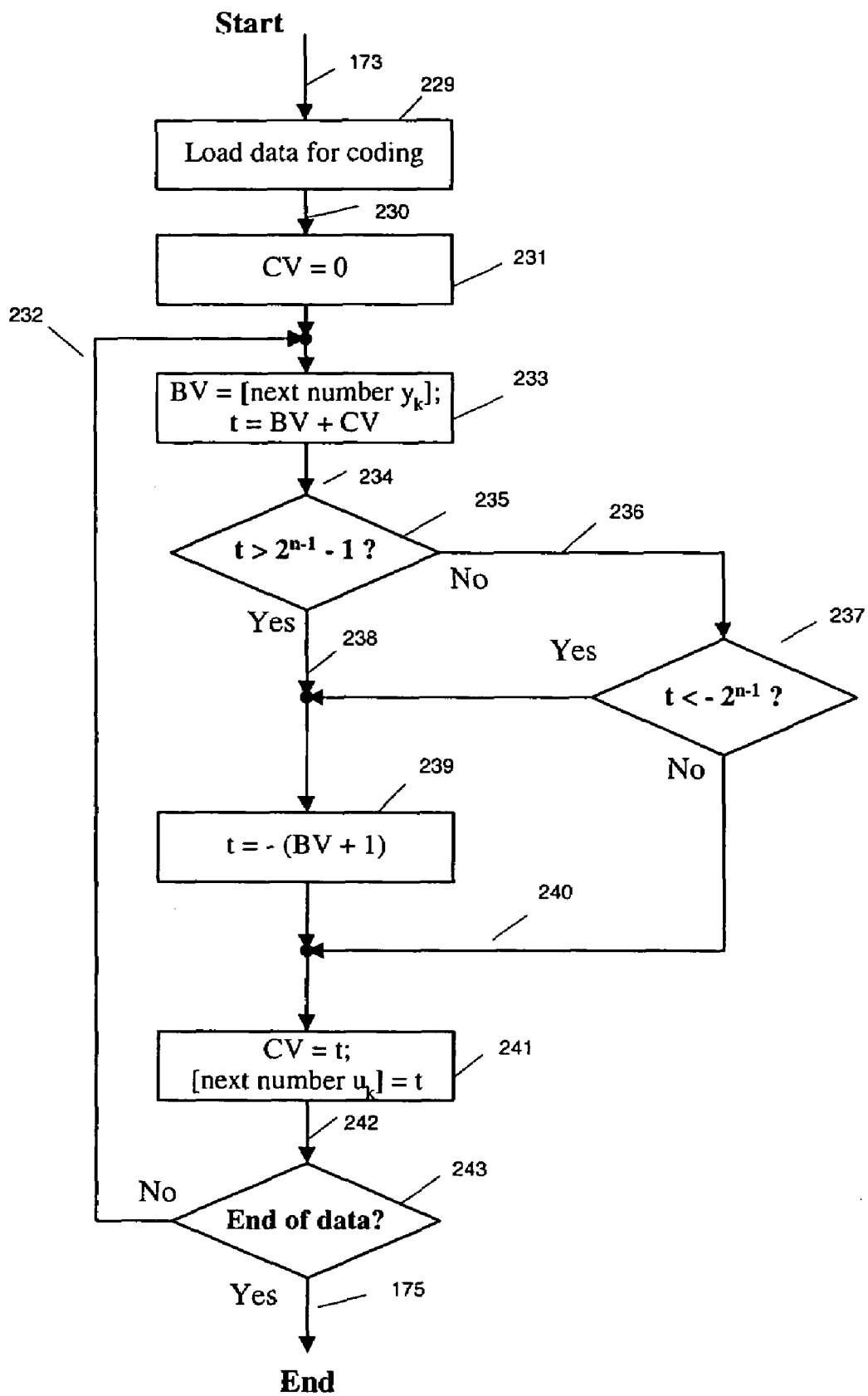
FIG. 8 is a block diagram of a third portion of a decoding algorithm according to a preferred embodiment of the present invention.

A more detailed block diagram of the algorithm implemented by the decoder section of the preferred embodiment of the present invention is presented in FIGS. 6, 7, and 8. Input 153 of the decoder, presented in FIG. 6, is connected with block 154 for setting the initial settings and for coded data storage. Output 155 of block 154 is connected with the input of block 156 for loading the control words and control flags. Output 157 of block 156 is connected with the input of block 161, where it is checked if the flag $F_{CBRL}$ is equal to zero. Output 159 (the "yes" output) of block 161 is connected with the input of block 168, where the data is stored in the output buffer without decoding. Output 158 (the "no" output) of block 161 is connected with the input of block 160, where the additional data from the coded data header is prepared for processing. Output 162 of block 160 is connected with the input of block 163, where it is checked if the flag $F_{SEQ}$ is equal to zero. Output 164 (the "no" output) of block 163 is connected with the input of block 165, where the corresponding data from the header is stored. Output 166 (the "yes" output) of block 163 is connected with the output of block 165 and with the input of block 167, where the coded data is processed with DARL decoding (presented, in detail in FIG. 7). Output 169 of block 167 is connected with the input of block 170, where the data is inversely modified and stored. Output 171 of block 170 is connected with the input of block 172, where it is checked if the flag $F_{SSP}$ is equal to zero. Output 173 (the "no" output) of block 172 is connected with the input of block 174, where the SSP decoding (presented in detail in FIG. 8) is performed, and the decoded data is saved in the corresponding memory. Output 175 (the "yes" output) of block 172 is connected with the outputs of blocks 168 and 174, and this is the output of the decoder section as well.

DARL decoding in correspondence with the preferred embodiment of the present invention is presented in FIG. 7. Input 166 of the block for DARL decoding is connected with block 176, where the coded data is loaded. Output 177 of block 176 is connected with the output of block 228, where it is checked if all of the data has been processed, and with the input of block 178, where the next number for decoding is loaded. Output 179 of block 178 is connected with the input of block 181, where it is checked if the value of the start position is less than or equal to the buffer value BV. First output 182 (the "yes" output) of block 181 is connected with the input of block 184, where it is checked if the buffer value BV is less than the start position value plus the length of the sequence of not-used values in the data histogram. Second output 180 (the "no" output) of block 181 is connected with second output (the "no" output) of block 184 and with the input of block 186, where the value of the next number is loaded. Output 185 (the "yes" output) of block 184 is connected with the input of block 183, where the length of the decoded sequence is calculated. Output 189 of block 183 is connected with the input of block 190, where it is determined if P=1. First output 188 (the "yes" output) of block 190 is connected with the input of block 187, where the next number from the coded sequence is loaded into the buffer value BV. Second output 199 (the "no" output) of block 190 is connected with the output of block 220, with the output of block 213 and with the input of block 224.

In blocks 220, 213, and 224, the decoded numbers are prepared in accordance with the preferred embodiment of the present invention. Output 192 of block 187 is connected with the input of block 194 (where the value m is set equal to 1), whose output 196 is connected with the input of block 198 (where it is checked if the buffer value BV is equal to 1). First output 202 (the "no" output) of block 198 is connected with the input of block 205, where it is checked if the buffer value BV is equal to zero. Second output 191 (the "yes" output) of block 198 is connected with the input of block 193, where the next number for decoding is loaded. First output 209 (the "yes" output) of block 205 is connected with the input of block 204, where the value m is increased by 1, and with the first output (the "yes" output) of block 216. Output 207 of block 204 is connected with the input of block 210 (where the next value from the coded sequence is loaded into the buffer), whose output 214 is connected with the input of block 216, where it is checked if the buffer value BV is equal to zero. Second output 219 (the "no" output) of block 216 is connected with the input of block 220, where the decoded information is prepared. Second output 211 (the "no" output) of block 205 is connected with the input of block 213, where the length of the decoded sequence is calculated. Output 195 of block 193 is connected with the input of block 197. First output 201 (the "no" output) of block 197 (where it is checked if buffer value BV is equal to zero) is connected with the input of block 217 (where the value of P is calculated). Second output 200 (the "yes" output) of block 197 is connected with the input of block 203 (where the value of m is increased) and with the first output (the "yes" output) of block 215, where it is checked if the buffer value BV is equal to zero. Output 206 of block 203 is connected with the input of block 208, where the new buffer value BV is loaded. Output 212 of block 208 is connected with the input of block 215. Second output 218 (the "no" output) of block 215 is connected with the input of block 222, where the decoded information is prepared. Output 221 of block 217 is connected with the output of block 222 and with the input of block 223, where the next value for the decoding is loaded. Output 226 of block 223 is connected with the input of block 227, where the decoded data is prepared and saved. Output 225 of block 224 is connected with the input of block 228 and with the outputs of blocks 186 and 227. Second output 169 (the "yes" output) of block 228 is the output of the section for DARL decoding.

The SSP decoding in correspondence with the preferred embodiment of the present invention is presented in FIG. 8. Input 173 to the section for SSP decoding is connected with block 229, where the data sequence for decoding is loaded. Output 230 of block 229 is connected with the input of block 231, where the current value (CV) is set initially to be equal to zero. Output 232 of block 231 is connected with the input of block 233, and with the first output (the "no" output) of block 243, where it is checked if all of the data has already been processed. In block 233 the value in the buffer (BV) is set to be that of the next number from the decoded sequence, and the sum of the buffer value (BV) and the current value (CV) is calculated. Output 234 of block 233 is connected with the input of block 235, where it is checked if the value of the sum calculated in block 233 is greater than $(2^{n-1}-1)$. First output 238 (the "yes" output) of block 235 is connected with the input of block 239 and with the first output (the "yes" output) of block 237. In block 237 it is checked if the value of the sum calculated in block 233 is less than $(-2^{n-1})$. In block 239 the final value of the sum is set. Second output 236 (the "no" output) of block 235 is connected with the input of block 237. Output 240 of block 239 is connected with the input of block 241 and with the second output (the "no" output) of block 237. In block 241 the current value CV is set to be equal to the next number from the decoded data sequence. Output 242 of block 241 is connected with the input of block 243, whose second output 175 (the "yes" output) is the output of the section for SSP coding.

An evaluation of the performance of the preferred embodiment of the present invention may now be presented. The basic criterion for evaluation of the efficiency of any compression method is the calculation of the compression ratio obtained as a result of the processing. The compression ratio is calculated as a relation between the input and the compressed data, i.e., K=N/(S+W), where W is the number of the words comprising the header. The minimum value $K_{min}$=N/(N+1)<1 is obtained for the case when the input data $x_k$ is not compressed. In this case S=N and W=1, since the added header consists of one word only (the control word). The maximum value of K is obtained for $x_k$=x (k=1, 2, ..., N). In this case, P=N, S=2m, W=4, and $K_{max}$≦N/[(2/n)$lg_2$N+4]. It follows then that the compression ratio K for the preferred embodiment of the present invention is between the limits:

$$\frac{N}{N+1} \le K \le \frac{N}{lg_2 \sqrt[n]{N^2} + 4}.$$

For $N \gg 1$ we obtain $1 \le K \le N/lg_2\sqrt[n]{N^2}$.

The analysis presented above demonstrates that the compression ratio can achieve significant values when there are long sequences of the same number in the processed data sequence $v_k$. This is confirmed with the examples for data compression with DARL encoding according to a preferred embodiment of the present invention, as will be presented below.

In a first example, the input data is a sequence of 8-bit binary (n=8) words with length of 65536 (N=65536), as follows:

|     | 1, 2, 3, ...    | 127, 128, ...          | 255, 256 |
| --- | --------------- | ---------------------- | -------- |
| 1   | 0, 1, 2, 3, ... | 127, −128, −127, −126, ... | −2, −1,  |
| 2   | 0, 1, 2, 3, ... | 127, −128, −127, −126, ... | −2, −1,  |
| .   |                 |                        |          |
| 256 | 0, 1, 2, 3, ... | 127, −128, −127, −126, ... | −2, −1.  |

In order to make the example more clear for purposes of demonstration, the data is arranged as a table with 256×256 positions. The same data could be used as a sequence of 8-bit unsigned words. In this case the data could be represented as a two-dimensional digital grayscale image with size 256×256 pixels, as well.

The DARL coding of this data according to a preferred embodiment of the present invention is performed in two stages. The first stage is the application of a preliminary transform to the input data. The steps in this stage are as follows:

1. A histogram analysis for the input data $x_k$ is done:
The histogram H(x) is:

H(−128)=256, H(−127)=256, ..., H(−2)=256, H(−1)=256, H(0)=256,

H(1)=256, H(2)=256, H(3)=256, ..., H(126)=256, H(127)=256;

The number of not-used values in the histogram is L(x)=0;

2. The difference $y_k$ is calculated, with SSP encoding of $x_k$, the result being that the input data sequence $x_k$ is transformed into $y_k$, as follows:

|     | 1, 2, 3, ...    | 127, 128, ...    | 255, 256 |
| --- | --------------- | ---------------- | -------- |
| 1   | 0, 1, 1, 1, ... | 1, 127, 1, 1, ... | ... 1, 1, |
| 2   | 0, 1, 1, 1, ... | 1, 127, 1, 1, ... | ... 1, 1, |
| .   |                 |                  |          |
| 256 | 0, 1, 1, 1, ... | 1, 127, 1, 1, ... | ... 1, 1. |

3. A histogram analysis for the data $y_k$ is performed:
The histogram H(y) is:

H(−128)=0, H(−127)=0, ... H(−2)=0, H(−1)=0, H(0)=1,

H(1)=65279, H(2)=0, H(3)=0, ... H(126)=0, H(127)=256;

The number of the not-used (free) values in the histogram is L(y)=253;

The start positions $p_i$=$y_i$ and the lengths ($\Delta l_i$+1) of the corresponding free ranges, for which H(y)=0, are:

$p_1$=−128, $\Delta l_1$=127; $p_2$=2, $\Delta l_2$=124.

The start position and the length of the range of free values with maximum length in the data sequence $y_k$ are correspondingly:

$p(y)$=$p_1$=−128 and $l(y)$=$\Delta l_1$=127;

4. The conditions L(x)=0 and L(y)=0 are checked. These conditions are satisfied when there are no free intervals in the two histograms. The calculated values are: L(x)=0 and L(y)=253, i.e., the transform continues with the setting of the flag $F_{CBRL}$=1.

5. The sequence that is more suitable for the coding is selected. In this case it is $y_k$, because L(x)=0. The flag $F_{SSP}$=1 is thus set.

6. The value y=r(y) is defined, for which the histogram H(y)=max.

r(y)=1−H(1)=65279=max.

7. The difference $v_k$ of $y_k$ and r(y) is calculated without carry, the result of which is that the data sequence $y_k$ is transformed into $v_k$, as shown below.

|     | 1, 2, 3, ...      | 127, 128, ...    | 255, 256 |
| --- | ----------------- | ---------------- | -------- |
| 1   | −1, 0, 0, 0, ...  | 0, 126, 0, 0, ... | ... 0, 0, |
| 2   | 0, 0, 0, 0, ...   | 0, 126, 0, 0, ... | ... 0, 0, |
| .   |                   |                  |          |
| 256 | 0, 0, 0, 0 ...    | 0, 126, 0, 0, ... | ... 0, 0. |

8. A histogram analysis of the $v_k$ data is performed:
The histogram H(v) is:

H(−128)=0, H(−127)=0, ... H(−2)=0, H(−1)=1, H(0)=65279,

H(1)=0, H(2)=0, H(3)=0, . . . H(126)=256, H(127)=0;

The number of the not-used (free) values in the histogram is L(v)=253;

The start positions $p_i$=$v_i$ and the lengths ($\Delta l_i$+1) of the corresponding sequence of not used values, for which H(v)=0, are:

$p_1$=−128, $\Delta l_1$=126; $p_2$=1, $\Delta l_2$=124; $p_3$=127, $\Delta l_3$=0.

The start position and the length of the sequence of not-used values with maximum length in the sequence $v_k$ are as follows:

$$p(v)=p_1=-128,\ l(v)=\Delta l_1=126;$$

The second stage of the process is the coding of the transformed data from the first stage. Applying DARL coding, the data sequence $v_k$ is transformed into $w_s$:

$w_{00}$—control word, where $F_{CBRL}=1$ and $F_{SSP}=1$;

$w_{01}=r(v)=1$;

$w_{02}=p(v)=-128$;

$w_{03}=l(v)=126$;

$w_1$-$w_{770}$, as follows:

|   | 1, 2, 3, . . . | 127, 128, . . . | 255, 256 |
|---|---|---|---|
| 1 | −1, [−128 + (126 − 1)] = −3, | 126, −128, 254, |  |
| 2 |  | 126, −128, 254, |  |
| . |  |  |  |
| . |  |  |  |
| 256 |  | 126, −128, 127. |  |

The compression ratio for the input data $x_k$ is thus K=N/S:

$$K=65536/(770+4)=84.67$$

For purposes of comparison, it may be seen that when the same data is compressed Microsoft Corporation's published run-length encoding algorithm, the compression ratio is:

$$K=65536/67072=0.98$$

In a second example, the input data comprises a sequence of 8-bit binary (n=8) words with length of 65536 (N=65536), arranged as a table:

|   | 1, 2, 3, . . . | 127, 128, . . . | 255, 256 |
|---|---|---|---|
| 1 | 5, 5, 5, 5, . . . | 5, 5, 5, 5 . . . | . . . 5, 5, |
| . |  |  |  |
| 128 | 5, 5, 5, 5, . . . | 5, 5, 5, 5 . . . | . . . 5, 5, |
| 129 | 120, 120, 120, . . . |  | . . . 120, 120, |
| 130 | 121, 121, 121, . . . |  | . . . 121, 121, |
| 131 | 122, 122, 122, . . . |  | . . . 122, 122, |
| 132 | 123, 123, 123, . . . |  | . . . 123, 123, |
| 133 | 5, 5, 5, 5, 5, 5, 5, 5, 120, . . . |  | . . . 120, 120, |
| 134 | 5, 5, 5, 5, 5, 5, 5, 5, 5, 120, . . . |  | . . . 120, 120, |
| 135 | 5, 5, 5, 5, . . . | 5, 120, . . . | . . . 120, 120, |
| 136 | 5, 5, 5, 5, . . . | 5, 5, 120, . . . | . . . 120, 120, |
| 137 | 121, 123, 123, . . . |  | . . . 123, 123, |
| 138 | 121, 121, 123, . . . |  | . . . 123, 123, |
| 139 | 121, 121, 121, 121, 123, . . . | . . . 123, 123, |  |
| . |  |  |  |
| 256 | 123, 123, 123, . . . |  | . . . 123, 123. |

The DARL coding of the example data is again performed in two stages. In the first stage, the input data is transformed according to the following steps:

1. A histogram analysis for the input data $x_k$ is done: The histogram H(x) is:

$H(-128)=0,\ \ldots\ H(0)=0,\ \ldots\ H(5)=33040,$
$H(6)=0,\ \ldots\ H(120)=1008,$ $H(121)=263,\quad H(122)=256,\quad H(123)=30969,$
$H(124)=0,\ \ldots\ H(127)=0;$ The number of the not-used (free) values in the histogram is L(x)=251;

The start positions $p_i=x_i$ and the lengths ($\Delta l_i+1$) of the corresponding sequence of not used values, for which H(x)=0 are:

$p_1=-128,\ \Delta l_1=133;\ p_2=6,\ \Delta l_2=113;\ p_3=124,\ \Delta l_3=3.$

The start position and the length of the corresponding sequence of not used values with maximum length in $x_k$ are:

$$p(x)=p_1=-128,\ l(x)=\Delta l_1=133;$$

2. The difference $y_k$ is calculated processing $x_k$ with SSP encoding, as a result of which the input sequence $x_k$ is transformed into $y_k$ as follows:

|   | 1, 2, 3, . . . | 127, 128, . . . | 255, 256 |
|---|---|---|---|
| 1 | 5, 0, 0, 0, . . . | 0, 0, 0, 0, . . . | . . . 0, 0, |
| . |  |  |  |
| 128 | 0, 0, 0, 0, . . . | 0, 0, 0, 0, . . . | . . . 0, 0, |
| 129 | 115, 0, 0, . . . |  | . . . 0, 0, |
| 130 | 1, 0, 0, . . . |  | . . . 0, 0, |
| 131 | 1, 0, 0, . . . |  | . . . 0, 0, |
| 132 | 1, 0, 0, . . . |  | . . . 0, 0, |
| 133 | −118, 0, 0, 0, 0, 0, 0, 0, 115, 0, . . |  | . . . 0, 0, |
| 134 | −115, 0, 0, 0, 0, 0, 0, 0, 0, 115, 0, . . . |  | . . . 0, 0, |
| 135 | −115, 0, 0, 0, . . . | 0, 115, 0, . . . | . . . 0, 0, |
| 136 | −115, 0, 0, 0, . . . | 0, 0, 115, 0, . . . | . . . 0, 0, |
| 137 | 1, 2, 0, 0, . . . |  | . . . 0, 0, |
| 138 | −2, 0, 2, 0, 0, . . . |  | . . . 0, 0, |
| 139 | −2, 0, 0, 0, 2, 0, 0, . . . |  | . . . 0, 0, |
| . |  |  |  |
| 256 | 0, 0, 0, 0, . . . | 0, 0, 0, 0, . . . | . . . 0, 0. |

3. A histogram analysis for the input data $y_k$ is performed: The histogram H(y) is:

$H(-128)=0,\ \ldots\ H(-118)=1,\ H(-117)=0,\ \ldots$
$H(-115)=3,\ H(-114)=0,\ \ldots$ $H(-2)=2,\ H(-1)=0,\ H(0)=65517,\ H(1)=4,\ H(2)=3,$
$H(3)=0,\ \ldots\ H(5)=1,$ $H(6)=0,\ \ldots\ H(115)=5,\ H(116)=0,\ \ldots\ H(127)=0;$ The number of free values in the histogram is L(y)=248;

The start positions $p_i=y_i$ and the lengths of the corresponding ranges of the not used values ($\Delta l_i+1$), for which H(y)=0, are:

$p_1=-128,\ \Delta l_1=9;\ p_2=-117,\ \Delta l_2=1;\ p_3=-114,\ \Delta l_3=111;$ $p_4=-1,\ \Delta l_4=0;\ p_5=3,\ \Delta l_5=1;\ p_6=6,\ \Delta l_6=108;\ p_7=116;$
$\Delta l_7=11.$ The start position and the length of the longest sequence of not-used values in $y_k$ are:

$$p(y)=p_3=-114,\ l(y)=\Delta l_3=111;$$

4. The conditions $L(x)=0$ and $L(y)=0$ are checked. These conditions are satisfied when there are no free intervals in the two histograms. The calculated values are: $L(x)=251$ and $L(y)=248$. The transform thus continues with the setting of the flag $F_{CBRL}=1$.

5. The sequence that is more suitable for coding is selected. In this case, it is $y_k$, because $L(x)<253$. The flag $F_{SSP}=1$ is set.

6. The value $y=r(y)$ is defined, for which the histogram $H(y)=max$.

$r(y)=0$-$H(0)=65517=max$.

7. The difference $v_k$ is obtained subtracting $r(y)$ from $y_k$ without carry, as a result of which the data sequence $y_k$ is transformed into $v_k$, as shown, below.

|     | 1, 2, 3 ... | 127, 128, ... | 255, 256 |
| --- | --- | --- | --- |
| 1   | 5, 0, 0, 0, ... | 0, 0, 0, 0, ... | ... 0, 0, |
| .   |  |  |  |
| 128 | 0, 0, 0, 0, ... | 0, 0, 0, 0, ... | ... 0, 0, |
| 129 | 115, 0, 0, ... |  | ... 0, 0, |
| 130 | 1, 0, 0, ... |  | ... 0, 0, |
| 131 | 1, 0, 0, ... |  | ... 0, 0, |
| 132 | 1, 0, 0, ... |  | ... 0, 0, |
| 133 | −118, 0, 0, 0, 0, 0, 0, 0, 115, 0, ... |  | ... 0, 0, |
| 134 | −115, 0, 0, 0, 0, 0, 0, 0, 0, 115, 0, ... |  | ... 0, 0, |
| 135 | −115, 0, 0, 0, ... | 0, 115, 0, ... | ... 0, 0, |
| 136 | −115, 0, 0, 0, ... | 0, 0, 115, 0, ... | ... 0, 0, |
| 137 | 1, 2, 0, 0, ... |  | ... 0, 0, |
| 138 | −2, 0, 2, 0, 0, ... |  | ... 0, 0, |
| 139 | −2, 0, 0, 0, 2, 0, 0, ... |  | ... 0, 0, |
| .   |  |  |  |
| 256 | 0, 0, 0, 0, ... | 0, 0, 0, 0, ... | ... 0, 0. |

8. A histogram analysis of the $v_k$ data is performed:

$H(-128)=0, \ldots H(-118)=1, H(-117)=0, \ldots$
$H(-115)=3, H(-114)=0, \ldots$ $H(-2)=2, H(-1)=0, H(0)=65517, H(1)=4, H(2)=3,$
$H(3)=0, \ldots H(5)=1,$ $H(6)=0, \ldots H(115)=5, H(116)=0, \ldots H(127)=0;$ The number of the not-used (free) values in the histogram is $L(v)=248$;

The start positions $p_i=v_i$ and the lengths $(\Delta l_i+1)$ of the corresponding sequences of not-used values, for which $H(v)=0$, are:

$p_1=-128, \Delta l_1=9; p_2=-117, \Delta l_2=1; p_3=-114, \Delta l_3=111;$ $p_4=-1, \Delta l_4=0; p_5=3, \Delta l_5=1; p_6=6, \Delta l_6=108; p_7=116, \Delta l_7=11.$ The obtained start position and length of the longest sequence of not-used values in $v_k$ are as follows:

$p(v)=p_3=-114, l(v)=\Delta l_3=111;$

In the second stage, the transformed data is encoded. As a result of the DARL coding, the data sequence $v_k$ is transformed into $w_s$:

$w_{00}$-the control word, in which: $F_{CBRL}=1, F_{SSP}=1;$ $w_{01}=r(y)=0;$ $w_{02}=p(v)=-114;$ $w_{03}=l(v)=111;$ $w_1$-$w_{55}$, as follows:

|     | 1, 2, 3, ... | 127, 128, ... | 255, 256 |
| --- | --- | --- | --- |
| 1   | 5, −114, 0, [32766] = 127, 254, |  |  |
| .   |  |  |  |
| 128 |  |  |  |
| 129 | 115, −114, 254, |  |  |
| 130 | 1, −114, 254, |  |  |
| 131 | 1, −114, 254, |  |  |
| 132 | 1, −114, 254, |  |  |
| 133 | −118, [−114 + (7 − 1)] = −108, 115, −114, 246, |  |  |
| 134 | −115, [−114 + (8 − 1)] = −107, 115, −114, 245, |  |  |
| 135 | −115, −114, 125, | 115, −114, 127, |  |
| 136 | −115, −114, 126, | 115, −114, 126, |  |
| 137 | 1, 2, −114, 253, |  |  |
| 138 | −2, 0, 2, −114, 252, |  |  |
| 139 | −2, [−114 + (3 − 1)] = −112, 2, −114, 0, [30202] = 117, 250. |  |  |
| .   |  |  |  |
| 256 |  |  |  |

The compression ratio for the input data $x_k$ is K=N/S:

$$K=65536/(55+4)=1110.77.$$

For purposes of comparison, when the same data sequence is compressed with Microsoft Corporation's run-length encoding algorithm, the compression ratio is:

$$K=65536/1542=42.50.$$

A specific advantage of the preferred embodiment of the present invention for coding and decoding of data is that it requires only the operations "sorting" and "addition"; the operation "multiplication" is not used. As a result, the corresponding algorithms for the implementation of the DARL method are relatively fast, and the decoding is much more simple than the coding. An advantage of the method that follows from this fact is that it allows one to obtain a very large compression ratio in the case when the input data contains very long sequences of numbers with the same value. These basic characteristics distinguish the preferred embodiment of the present invention from the previously known methods for data compression based on run-length encoding.

Experimental results obtained for the preferred embodiment of the present invention confirm the conclusions drawn above. In order to obtain an even higher compression ratio, the disclosed method could be combined with other widely known methods for preliminary processing, as for example the pyramidal decomposition or any kind of orthogonal transforms, and with the previously known methods for lossless compression, such as arithmetic coding and Huffman codes. The results of the investigation performed by the inventors hereof show that the preferred embodiment of the present invention is very efficient for the compression of data obtained after the transformation of large, two-dimensional (2D) digital images into one-dimensional (1D) sequences. By way of example, such images may include graphics, text, signatures, fingerprints, halftone contour images, photographs with non-regular histograms, and cartoons.

The preferred embodiment of the present invention may be used with respect to a variety of applications where lossless compression is required. These include the creation of new formats for data and pictures storage without data loss, aimed at multimedia databases; the creation of new algorithms for image compression, which may be integrated with already existing families of standards such as JPEG and MPEG, and in the software of digital scanners, still cameras, and video cameras; the creation of special devices for data transfer, such as facsimile machines, mobile phones, and mobile video phones, for surveillance and medical applications, smart cards, and the like; and the creation of new application software and systems based on the Internet and other digital communications networks, such as e-commerce, distance learning and medical services, games, and digital television. The invention is not limited to these technologies, and will likely find application in future technologies where lossless data compression is required as well.

The present invention has been described with reference to certain preferred and alternative embodiments that are intended to be exemplary only and not limiting to the full scope of the present invention as set forth in the appended claims.

We claim:

1. A method for lossless coding of data sequences, comprising the steps of:
   (a) constructing a first data histogram from a first data sequence comprising a plurality of numbers;
   (b) analyzing the first data histogram;
   (c) encoding the first data sequence to obtain a second data sequence;
   (d) calculating a second data histogram from the second data sequence;
   (e) analyzing the second data histogram;
   (f) selecting a preferred data sequence from between the first data sequence and the second data sequence based upon a comparison of the first and second histogram analyses;
   (g) modifying the preferred data sequence to produce a modified data sequence;
   (h) calculating a modified data histogram from the modified data sequence; and
   (i) encoding the modified data sequence to produce a coded data sequence.

2. The method of claim 1, further performing the step of constructing a coded data header.

3. The method of claim 2, wherein at least one of said steps for performing histogram analysis comprises a definition of single not-used values or sequences of not-used values in the corresponding data histogram.

4. The method of claim 2, wherein at least one of said steps for performing histogram analysis comprises a definition of the lengths of the sequences of not-used values in the corresponding data histogram.

5. The method of claim 4, wherein at least one of said steps for performing histogram analysis comprises a definition of a longest sequence of not-used values and a position of the first value in the longest sequence.

6. The method of claim 2, further comprising the step of arranging the coded data sequence and coded data header.

7. The method of claim 1, wherein said step of encoding the first data sequence comprises the step of performing size-saving prediction (SSP) encoding.

8. The method of claim 7, wherein said step of performing SSP encoding comprises the step of calculating for every number in the first data sequence a difference between its current value and a value of a preceding number in the first data sequence.

9. The method of claim 8, wherein said step of performing SSP encoding further comprises the step of, where the difference obtained between the current value in the first data sequence and the value of the preceding number in the first data sequence is outside of a range of numbers set for the first data sequence, calculating a sum of the current value and "1," and calculating a negative value of this sum.

10. The method of claim 7, wherein said step of performing SSP encoding comprises an arrangement of the second data sequence.

11. The method of claim 1, wherein said step of analyzing the second data histogram comprises at least one of the steps of defining single not-used values in the second data histogram and defining sequences of not-used values in the second data histogram.

12. The method of claim 11, wherein said step of analyzing the second data histogram further comprises at least one of the steps of defining the lengths of the sequences of not-used values in the second data histogram and defining the longest sequence of not-used values in the second data histogram.

13. The method of claim 12, further comprising the step of identifying a position of a first value in the sequence of not-used values in the second data sequence.

14. The method of claim 12, wherein said step of selecting the preferred data sequence comprises a consideration of which of said first and second histograms contains longer sequences of not-used values.

15. The method of claim 1, further performing an identification of a most frequent value in a selected histogram, wherein the most frequent value comprises that value for which the histogram has an arithmetic maximum.

16. The method of claim 1, wherein said step of modifying the preferred data sequence comprises the step of calculating a difference between a value of every consecutive number of the preferred data sequence and a most frequent value of the preferred data sequence.

17. The method of claim 16, further comprising the step of analyzing the modified data histogram.

18. The method of claim 17, wherein the step of analyzing the modified data histogram comprises the step of defining a longest sequence of not-used values.

19. The method of claim 18, wherein the step of analyzing the modified data histogram further comprises the step of determining a position of the first not-used value in the modified data sequence.

20. The method of claim 1, wherein said step of encoding the modified data sequence comprises the step of performing data-adaptive run-length (DARL) encoding.

21. The method of claim 20, wherein said step for DARL encoding comprises the step of replacing every string of numbers in the modified data sequence with the same value by a shorter string in the coded data sequence.

22. The method of claim 21, wherein every sequence of zeros whose length is shorter than that of a longest sequence of not-used values in the modified data histogram is replaced by one word, using a correspondence between the length of the coded sequence and a corresponding place in a longest sequence of not-used values.

23. The method of claim 20, wherein said step for DARL encoding comprises the step of replacing every string of numbers in the modified data sequence with the same value by a shorter string in the coded data sequence, such that every zero sequence whose length is larger than that of a longest sequence of not-used values in the modified data histogram is replaced by 2m words, where the first word comprises a position of the first value of the sequence of not-used values, the next (m−1) words comprise the value zero, and the remaining m words comprise the value of the coded length minus 1.

24. The method of claim 20, wherein said step for DARL encoding comprises the step of replacing every string of non-zero numbers in the modified data sequence with a same value by a shorter string in the coded data sequence, such that every sequence of same values with a length greater than 4 is replaced by (2m+2) words, where a first two words comprise a position of a first value of the sequence of not-used values and a value "1," respectively, the next (m−1) words comprise a value zero, the next m words comprise the value of the coded length minus 1, and a last word comprises a coded number that is different from zero.

25. The method of claim 20, wherein said step for DARL encoding comprises the step of, for every sequence of numbers with the same value, different from zero, whose length is shorter than 4, retaining such numbers unchanged in said coded data sequence.

26. A method for decoding a coded data sequence comprising a header, the method comprising the steps of:

(a) analyzing the coded data sequence header, wherein said analyzing step comprises the step of determining whether the coded data sequence was in fact encoded;

(b) decoding the coded data sequence to produce a modified data sequences, wherein said step of decoding the coded data sequence to produce a modified data sequence comprises the step of performing data-adaptive run-length (DARL) decoding;

(c) performing inverse data modification on the modified data sequence to produce an unmodified data sequence; and (d) decoding the unmodified data sequence to produce an unencoded data sequence.

27. The method of claim 26, wherein said step of performing DARL decoding comprises the steps of restoring an initial data sequence, subtracting from every coded word of the coded data sequence a number that is a start value of the longest sequence of not-used values, and replacing in correspondence with the obtained difference a current coded word in the coded data sequence with a modified word comprising a string of same numbers in the modified data sequence.

28. The method of claim 27, wherein said step of performing DARL decoding comprises the steps of restoring an initial data sequence, subtracting from every coded word of the coded data sequence a number that is a start value of a longest sequence of not-used values, and, when the calculated difference is one of a negative number and a number that is larger than a length of the longest sequence of not-used values in a histogram of the resulting data, reduced by one, producing a modified word in the modified data sequence that is equal to the corresponding coded word in the coded data sequence.

29. The method of claim 28, wherein when the calculated difference is a positive number and is not larger than a length of the longest sequence of not-used values, replacing a current coded word in the coded data sequence by a sequence of processed words, containing zeros, with length equal to the calculated difference, increased by one, in the modified data sequence.

30. The method of claim 29, wherein when the calculated difference is zero, and a next coded word in the coded data sequence after the current coded word is other than zero, replacing the current coded word and the next coded word by a sequence of modified words with length equal to a value of the next coded word, increased by one, in the modified data sequence.

31. The method of claim 30, wherein when the calculated difference is zero, the next (m−1) coded words after the current coded word in the coded data sequence each comprise a value equal to zero, and after the next (m−1) coded words follow m coded words comprising a value other than zero, replacing the current coded word and the next (2m−1) coded words by a sequence of modified words, containing zeros, with length equal to the value of the last m coded words, increased by one.

32. The method of claim 31, wherein when the calculated difference is zero, the next coded word after the current coded word comprises a value equal to one, and after that follows a next coded word, different from zero, replacing the current coded word and the next three coded words by a sequence of modified words comprising the same value, different from zero, with length equal to the number stored in the next coded word, increased by one, and with value equal to the value in the last coded word.

33. The method of claim 32, wherein when the calculated difference is zero, the next coded word after the current coded word comprises a value equal to one, and after that follows a sequence of (m−1) coded words comprising a value equal to zero and a sequence of m coded words comprising a value other from zero, replacing the current coded word and the next (2m−1) coded words by a sequence of modified words comprising a value other than zero with a length equal to the number stored in the sequence of (m−1) coded words, increased by 1, and with a value equal to the value in the last word.

34. The method of claim 26, wherein said step of performing inverse data modification comprises the step of adding a most frequent value to every number in the modified data sequence without carry.

35. The method of claim 26, wherein said step of decoding the unmodified sequence to produce an unencoded data sequence comprises the step of performing size-saving prediction (SSP) decoding.

36. The method of claim 35, wherein said step of SSP decoding comprises the step of calculating an arithmetic sum of a current modified word of the modified data sequence from a set of transformed data and a word preceding the current modified word.

37. The method of claim 36, wherein said step for SSP decoding comprises the step of, if the arithmetic sum is above the range of the transformed data, replacing the current modified word of the modified data sequence with a negative of a sum of the current modified word and the value one in the unmodified data sequence.

38. The method of claim 37, wherein said step for SSP decoding comprises the step of, if the arithmetic sum is equal or smaller than the range of the transformed data, replacing the current modified word of the modified data sequence with an unmodified word comprising a value equal to the arithmetic sum of the current modified word and the word preceding the current modified word in the unmodified data sequence.

39. An apparatus for lossless coding of data sequences, comprising:
(a) a first transform module operable to receive a first data sequence and return a first histogram;
(b) a first coding module operable to receive the first data sequence and return a second data sequence;
(c) a second transform module operable to receive the second data sequence and return a second histogram;
(d) a control module operable to receive the first and second histograms and determine a preferred data sequence from between the first data sequence and the second data sequence;
(e) a modification module operable to receive the preferred data sequence and return a modified data sequence and its histogram; and
(f) a coding module operable to receive the modified data sequence and return a coded data sequence.

40. The apparatus of claim 39, wherein said transform module is further operable to produce a first histogram analysis comprising one of a definition of single not-used histogram values and a sequence of not-used histogram values.

41. The apparatus of claim 39, wherein said transform module is further operable to produce a first histogram analysis comprising a definition of a longest sequence of not-used values and one of a start position of the longest sequence or a smallest single not-used value.

42. The apparatus of claim 39, wherein said first coding module is operable to perform size-saving prediction (SSP) encoding.

43. The apparatus of claim 39, wherein said control module is operable to determine a preferred data sequence based upon the determination of whether the first or the second histogram analysis comprises a definition of single not-used histogram values or a sequence of not-used histogram values.

44. The apparatus of claim 39, wherein said control module is operable to receive the results of two histogram analyses and to return a decision concerning which one is more suitable for further coding, said decision being dependent upon a presence of single not-used values or longer sequences of not-used values.

45. The apparatus of claim 39, wherein said modulation module is operable to subtract a most frequent value from each number of the preferred data sequence.

46. The apparatus of claim 39, wherein said transform module is further operable to produce a third histogram analysis comprising the definition of a sequence of not-used histogram values.

47. The apparatus of claim 39, wherein said coding module is operable to perform data-adaptive run-length (DARL) coding.

48. The apparatus of claim 39, further comprising an arrangement module operable to receive the coded data sequence and return an arranged coded data sequence comprising a header and a set of coded data.

49. An apparatus for decoding data sequences, comprising:
(a) a control word decoder module operable to receive a header of a coded data sequence and return a set of control conditions;
(b) a first decoder module operable to receive the coded data sequence and return a first data sequence;
(c) an unmodifier module operable to receive a first data sequence and return an unmodified data sequence; and
(d) a second decoder module operable to receive an unmodified data sequence and return a decoded data sequence.

50. The apparatus of claim 49, wherein said control word decoder module is operable to analyze a control word of the header and to return a set of decoding conditions.

51. The apparatus of claim 49, wherein said first decoder module is operable to perform data-adaptive run-length (DARL) decoding.

52. The apparatus of claim 50, wherein said unmodifier module is operable to return an unmodified data sequence by adding a most frequent value stored in the control word to each number in the first data sequence.

53. The apparatus of claim 49, wherein said second decoder module is operable to perform size-saving prediction (SSP) decoding.

* * * * *